United States Patent [19]

Okamura

[11] Patent Number: 5,684,321
[45] Date of Patent: Nov. 4, 1997

[54] SEMICONDUCTOR DEVICE HAVING AN INPUT PROTECTION CIRCUIT

[75] Inventor: Junichi Okamura, Kanagawa-ken, Japan

[73] Assignee: Kabushiki Kaisha Toshiba, Kawasaki, Japan

[21] Appl. No.: 481,828

[22] Filed: Jun. 7, 1995

[30] Foreign Application Priority Data

Nov. 10, 1994 [JP] Japan .................................. 6-276261

[51] Int. Cl.⁶ .............................. H01L 23/62; H01L 29/76
[52] U.S. Cl. ......................... 257/355; 257/356; 257/357; 257/358; 257/379
[58] Field of Search .............................. 257/355, 356, 257/357, 358, 379

[56] References Cited

U.S. PATENT DOCUMENTS

| | | | |
|---|---|---|---|
| 3,577,043 | 5/1971 | Cook | 317/235 R |
| 3,787,717 | 1/1974 | Fischer et al. | 317/235 R |
| 4,028,564 | 6/1977 | Streit et al. | 307/310 |
| 4,430,581 | 2/1984 | Mogi et al. | 307/296 R |
| 4,491,746 | 1/1985 | Koike | 307/296 R |
| 4,688,065 | 8/1987 | Kinoshita et al. | 357/23.13 |
| 4,739,437 | 4/1988 | Morgan | 361/88 |
| 4,757,363 | 7/1988 | Bohm et al. | 357/23.13 |
| 4,791,317 | 12/1988 | Winnerl et al. | 307/296 R |
| 4,829,350 | 5/1989 | Miller | 357/23.13 |
| 4,903,093 | 2/1990 | Ide et al. | 257/355 |
| 4,994,874 | 2/1991 | Shimizu et al. | 357/23.13 |
| 4,996,626 | 2/1991 | Say | 361/91 |
| 5,010,380 | 4/1991 | Avery | 357/23.13 |
| 5,016,078 | 5/1991 | Tailliet | 357/42 |
| 5,072,271 | 12/1991 | Shimizu et al. | 357/23.13 |
| 5,212,618 | 5/1993 | O'Neill et al. | 361/56 |
| 5,386,135 | 1/1995 | Nakazato et al. | 257/369 |

FOREIGN PATENT DOCUMENTS

| | | | |
|---|---|---|---|
| 0 324 185 | 7/1989 | European Pat. Off. | 257/362 |
| 27 22 892 | 12/1977 | Germany | 257/362 |
| 55-72081 | 5/1980 | Japan . | |
| 58-2061 | 1/1983 | Japan . | |
| 58-121663 | 7/1983 | Japan . | |
| 58-161375 | 9/1983 | Japan . | |
| 59-111351 | 6/1984 | Japan | 257/355 |
| 60-107865 | 6/1985 | Japan . | |
| 62-224057 | 10/1987 | Japan . | |
| 63-137478 | 7/1988 | Japan . | |
| 63-220564 | 9/1988 | Japan . | |
| 1-286354 | 11/1989 | Japan . | |

OTHER PUBLICATIONS

Momodomi et al., "A Circular Output Protection Device Using Bipolar Action", 25th Annual Proceedings—Reliability Physics, Apr. 1987, San Diego, California, US, pp. 169–173.

*Primary Examiner*—Mahshid D. Saadat
*Assistant Examiner*—Valencia Martin Wallace
*Attorney, Agent, or Firm*—Banner & Witcoff Ltd.

[57] ABSTRACT

An input protection circuit is formed on a semiconductor substrate. A resistive element of an impurity diffusion region is electrically isolated from a main region of the substrate by a first double well structure. A bipolar transistor is connected to the resistive element which is electrically isolated from the main region of the substrate by a second double well structure. An input pad is connected to the bipolar transistor.

25 Claims, 19 Drawing Sheets

SEMICONDUCTOR DEVICE HAVING AN INPUT PROTECTION CIRCUIT

BACKGROUND OF THE INVENTION

1. Technical Field

The present invention generally relates to input protection circuits for semiconductor devices, and, more particularly, to input protection circuits for dynamic random access memories (DRAMs).

2. Description of Related Art

Semiconductor integrated circuit devices may be adversely affected by large voltage pulses applied thereto. These large voltage pulses can result in the degradation of the semiconductor integrated circuit device characteristics, the breakdown of PN junctions, and the breakdown of insulating films, for example.

A plurality of pads, or bonding pads, are generally arranged at the peripheral portion of the integrated circuit device. These pads include a power source pad to which a power source voltage Vcc is applied, a ground pad to which a ground voltage Vss is applied, and signal input and output pads for receiving input signals from external devices and for supplying output signals to external devices, respectively. These pads are connected to leads of the integrated circuit device with bonding wires.

In general, input protection circuits are provided between the signal input pads and the internal circuits of the integrated circuit device in order to protect the internal circuits from breakdown due to the application of large voltage pulses. FIG. 1(a) is a sectional view of a portion of a first semiconductor device including an input protection circuit. An N-type impurity diffusion region 101 is formed in a P-type silicon substrate 100. A signal input pad 102 is connected to N-type diffusion region 101. Internal circuits such as an N-channel MOS transistor 103 are also formed in silicon substrate 100. The interface between P-type silicon substrate 100 and N-type diffusion region 101 forms a PN junction.

The input protection circuit of FIG. 1(a) works as follows. In a normal operation mode of the semiconductor device, which may be a DRAM, for example, the highest voltage which is applied to signal input pad 102 is equal to the voltage of a logic high level ("H"), for example, 3.3 V. In this case, the PN junction between silicon substrate 100 and diffusion region 101 is reverse-biased, and no current flows therethrough. However, a sudden application of a high voltage, for example 10 V, to input pad 102 causes the PN junction to breakdown. In this case, a current flows from input pad 102 through the PN junction to the P-type silicon substrate 100, thereby preventing application of the high voltage to the internal circuits. Accordingly, the internal circuits are protected from a sudden application of a high voltage.

However, the input protection circuit shown in FIG. 1(a) has the following problem. With reference to FIG. 1(b), when a sudden high voltage of 10 volts is applied to signal input pad 102, a high potential area, as shown by equipotential lines 104, surrounds signal input pad 102 because the resistance of silicon substrate 100 is relatively high. This high potential area surrounding pad 102 may cause a breakdown of a neighboring MOS transistor such as MOS transistor 103.

To avoid such a problem, the input protection circuit of FIG. 1(a) may be modified such that the input protection circuit and the internal circuits are electrically separated and isolated by well regions.

For example, FIG. 2(a) is a sectional view of a portion of a second semiconductor device having an input protection circuit. An N-type well 110 is formed in a P-type silicon substrate 100. A P-type well 111 is formed in N-type well 110. An N-type region 112 is formed in P-type well 111. N-type well 110 is supplied with Vcc (a logic high level "H"=Vcc) through an $N^+$-type high density impurity region 114. P-type well 111 is supplied with Vss (a ground level, or a logic low level "L"=Vss) by a ground pad 105 through a $P^+$-type high density impurity diffusion region 113. A plurality of N-type regions in addition to N-type region 112 may be formed in P-type well 111 to form parasitic bipolar transistors. However, for clarity, FIGS. 2(a) and 2(b) show a simple PN junction diode. P-type well 111 and N-type region 112 provide a PN junction.

The input protection circuit of FIG. 2(a) works as follows. In a normal operation mode of the device, the highest voltage which is applied to signal input pad 102 is Vcc, i.e., about 3.3 V. In this case, the PN junction formed by P-type well 111 and N-type region 112 is reverse-baised, and no current flows therethrough. However, a sudden application of a high voltage, for example 10 V, to signal input pad 102 causes the PN junction to breakdown. In this case, a current flows from signal input pad 102 through the PN junction, P-type well 111, and $P^+$-type region 113 to ground pad 105, thereby preventing the high voltage from reaching the internal circuits. Accordingly, the internal circuits are protected from a sudden application of a high voltage.

However, the circuit shown in FIG. 2(a) has the following problem. As shown in FIG. 2(b), a sudden application of a high negative voltage, for example −10 V, to signal input pad 102 causes the PN junction formed by N-type region 112 and P-type well 111 to be forward-biased, thereby causing a large current to flow to ground pad 105. Accordingly, a ground potential which is shared by the circuits of the semiconductor device rises, causing a malfunction of the semiconductor device. For example, this large current can cause a reference level to fluctuate, leading to the erroneous detection of the level of an input signal.

To avoid this problem, an input protection circuit as shown in FIG. 3(a) may be utilized. As shown in FIG. 3(a), a polysilicon resistive element 121 is inserted between signal input pad 102 and N-type region 112. When a negative potential is suddenly applied to the signal input pad, the fluctuation of the ground level is suppressed, because the resistive element and the parasitic capacitor formed by the impurity regions and wells function as an RC filter. Therefore, the problem of the fluctuation of ground level is avoided.

However, the input protection circuit shown in FIG. 3(a) has the following problem. During an electrostatic discharge (ESD) test which is conducted prior to selling the semiconductor integrated circuit devices, a very high voltage of about 3 KeV volts is suddenly applied across signal input pad 102 and ground pad 105. Since resistive element 121 is usually formed from thin polysilicon to reduce area occupation, the sudden application of the ESD test voltage melts resistive element 121 as shown in FIG. 3(b). Specifically, the ordinary ESD test voltage of about 3 KeV which is applied the semiconductor device causes 5 mA of current to flow through resistive element 121 for about 3 ns, thereby causing the polysilicon resistive element to melt down. Accordingly, the internal circuit can no longer be protected against high negative potentials suddenly applied to the signal input pad.

SUMMARY OF THE INVENTION

Accordingly, it is an object of the present invention to provide an input protection circuit which is capable of withstanding a sudden application of a positive and a negative high voltage, and an ESD testing.

More specifically, according to one aspect of the present invention, a semiconductor device includes a semiconductor substrate of a first conductivity type, a first terminal, and a second terminal. A first outer well of a second conductivity type is formed in the semiconductor substrate and a first inner well of the first conductivity type is formed in the first outer well. A second outer well of a second conductivity type is formed in the semiconductor substrate and a second inner well of the first conductivity type is formed in the second outer well. A resistive element including a diffusion region of the second conductivity type is formed in the first inner well and an input protection circuit element having at least one PN junction is formed in the second inner well. The resistive element and the input protection circuit element are connected in series between the first and second terminals.

In accordance with a second aspect of the present invention, an input protection circuit formed on a semiconductor substrate includes a resistive element including an impurity diffusion region electrically isolated from a main body of the semiconductor substrate by a first double well structure, a bipolar transistor connected to the resistive element and electrically isolated from the main body of the semiconductor substrate by a second double well structure, and an input terminal connected to the bipolar transistor.

In accordance with a third aspect of the present invention, an input protection circuit formed on a semiconductor substrate includes a first terminal, a second terminal and at least one PN junction. A resistive element including an impurity diffusion region is electrically separated from a main body of the semiconductor substrate. The PN junction and the resistive element are connected in series between the first and the second terminals. In accordance with a fourth aspect of the present invention, a semiconductor device includes a signal input pad for receiving an externally supplied input signal, an input protection circuit connected to the signal input pad, and a reference voltage generating circuit for generating a reference voltage. A comparison circuit connected to the input protection circuit and the reference voltage generating circuit compares the input signal and the reference voltage, wherein the reference voltage generating circuit and the input protection circuit are electrically isolated by a double well structure.

In accordance with a fifth aspect of the present invention, a semiconductor device includes a first pad, a second pad, and a third pad. A first bipolar transistor has a base, a first current terminal connected to the second pad, and a second current terminal connected to the first pad. A second bipolar transistor has a base, a first current terminal connected to the second pad, and a second current terminal connected to the third pad. A resistive element is separated from the first and the second bipolar transistors and electrically isolated from the current terminals of the first and the second bipolar transistors by a double well structure. The resistive element has a first terminal connected to the bases of the first and the second transistors and a second terminal connected to the third pad.

In accordance with a sixth aspect of the present invention, a semiconductor device includes a first pad, a second pad, and a third pad. A first bipolar transistor has a base connected to the third pad, a first current terminal, and a second current terminal connected to the first pad. A second bipolar transistor has a base connected to the third pad, a first current terminal, and a second current terminal connected to the third pad. A resistive element is separated from the first and the second bipolar transistors and electrically isolated from the current terminals of the first and the second bipolar transistors by a double well structure. The resistive element has a first terminal connected to the first current terminals of the first and the second transistor and a second terminal connected to the second pad.

In accordance with a seventh aspect of the present invention, a semiconductor device includes a plurality of pads arranged linearly, a plurality of input protection elements arranged linearly alongside the pads, and a signal bus arranged alongside the pads and the input protection elements. A resistive element is connected to and shared by the plurality of input protection elements.

In accordance with an eighth aspect of the present invention, a semiconductor device includes first, second, third, and fourth rectangular core blocks each having a plurality of memory cells arranged in matrix. A first buffer block is located between the first and the second rectangular core blocks and has a plurality of address pads and a first input protection circuits arranged linearly. A second buffer block is located between the third and the fourth rectangular core blocks and has a plurality of data I/O pads and a second input protection circuits arranged linearly. The first buffer block has a first resistive element electrically isolated from the first, second, third, and fourth core blocks by a first double well and the second buffer block has a second resistive element electrically isolated from the first, second, third, and fourth core blocks by a second double well.

BRIEF DESCRIPTION OF THE DRAWINGS

A more complete appreciation of the present invention and many of its attendant advantages will be readily obtained reference to the following detailed description considered in connection with the accompanying drawings, in which.

DETAILED DESCRIPTION

Figure 1A:
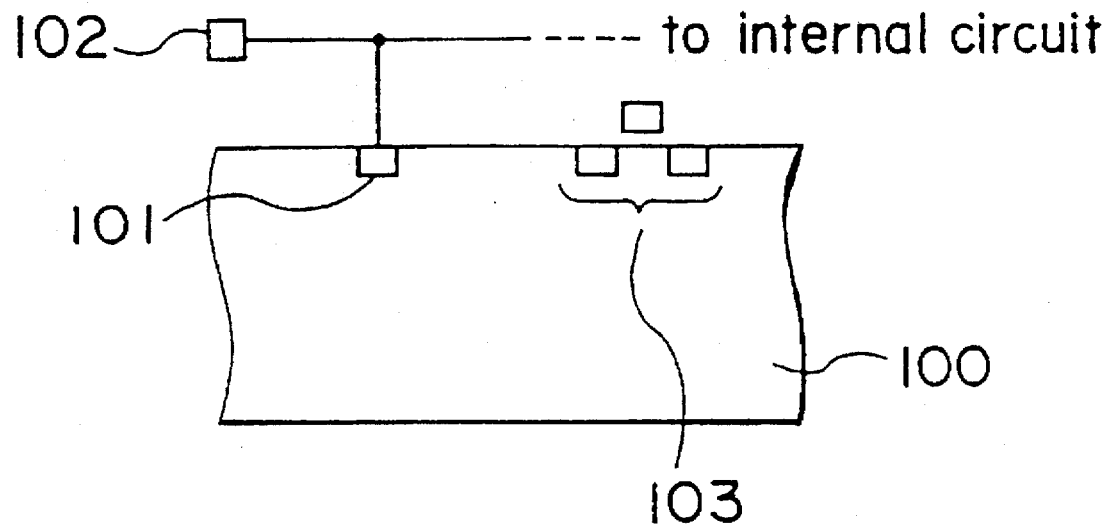
FIG. 1(a) is a sectional view of a portion of a first semiconductor device including an input protection circuit.
Figure 1B:
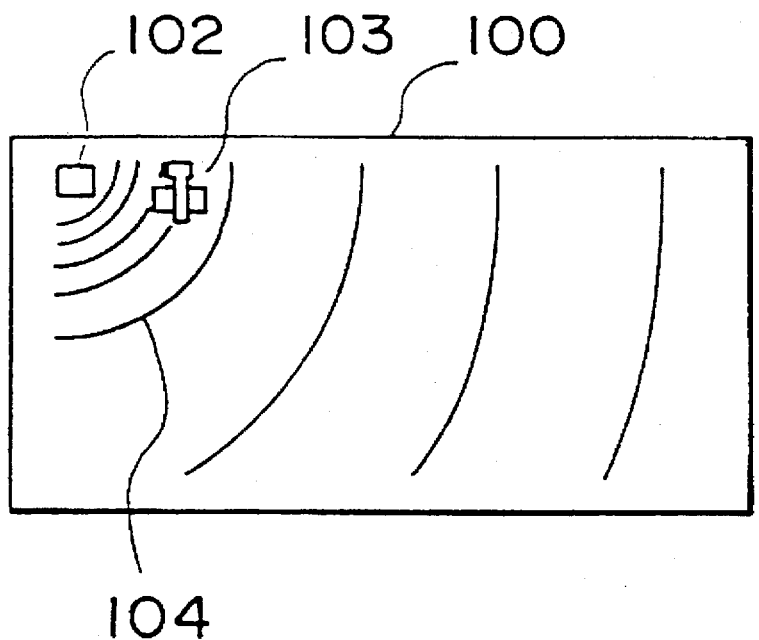
FIG. 1(b) is a plan view of the semiconductor device of FIG. 1(a)
Figure 2A:
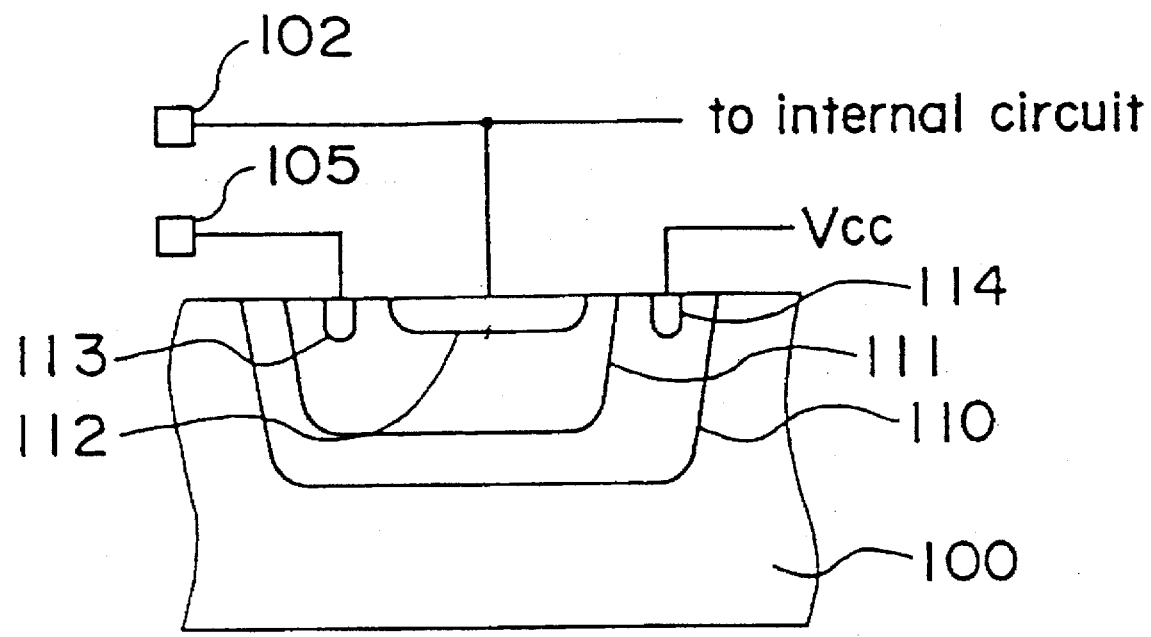
FIG. 2(a) is a sectional view of a portion of a second semiconductor device including an input protection circuit.
Figure 2B:
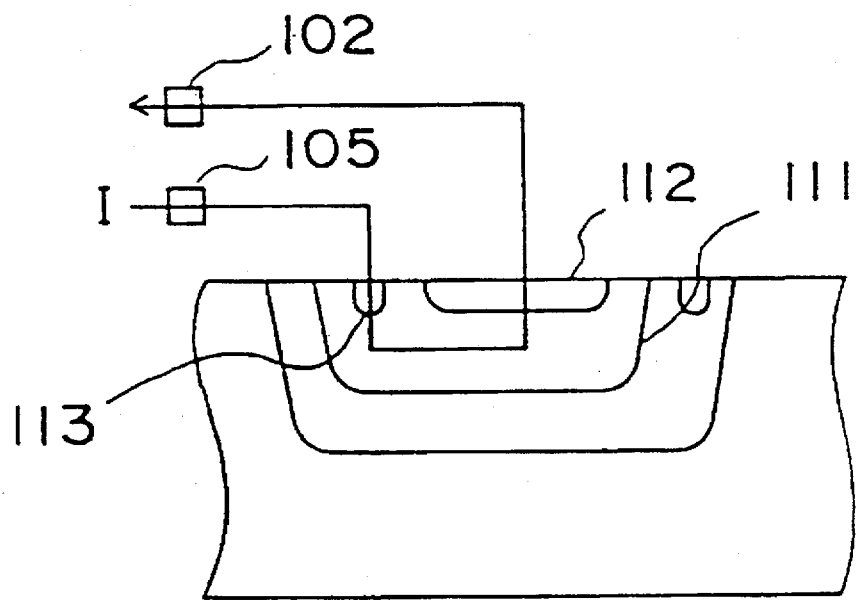
FIG. 2(b) illustrates the operation of the input protection circuit of FIG. 2(a)
Figure 3A:
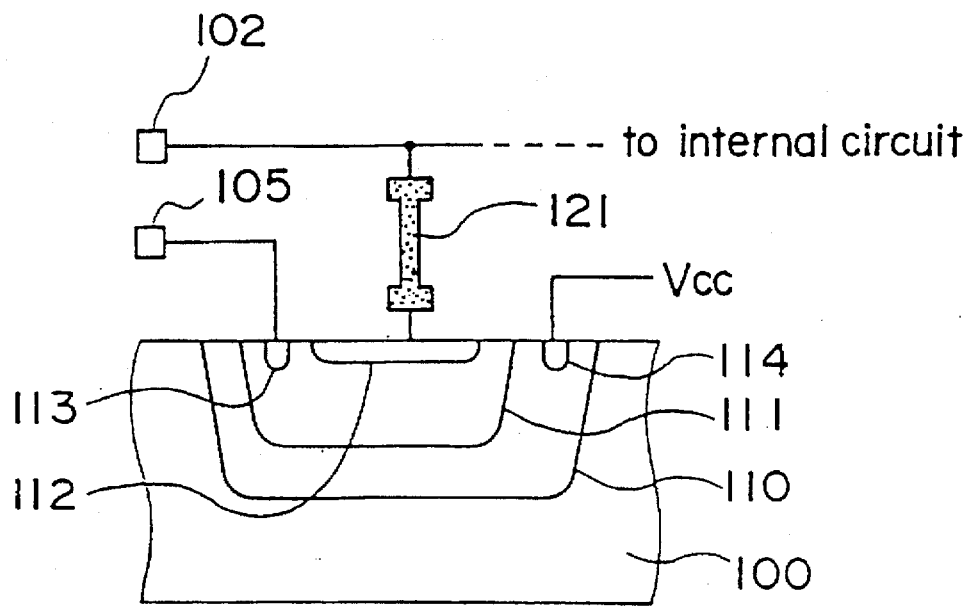
FIG. 3(a) is a sectional view of a portion of a third semiconductor device including an input protection circuit.
Figure 3B:
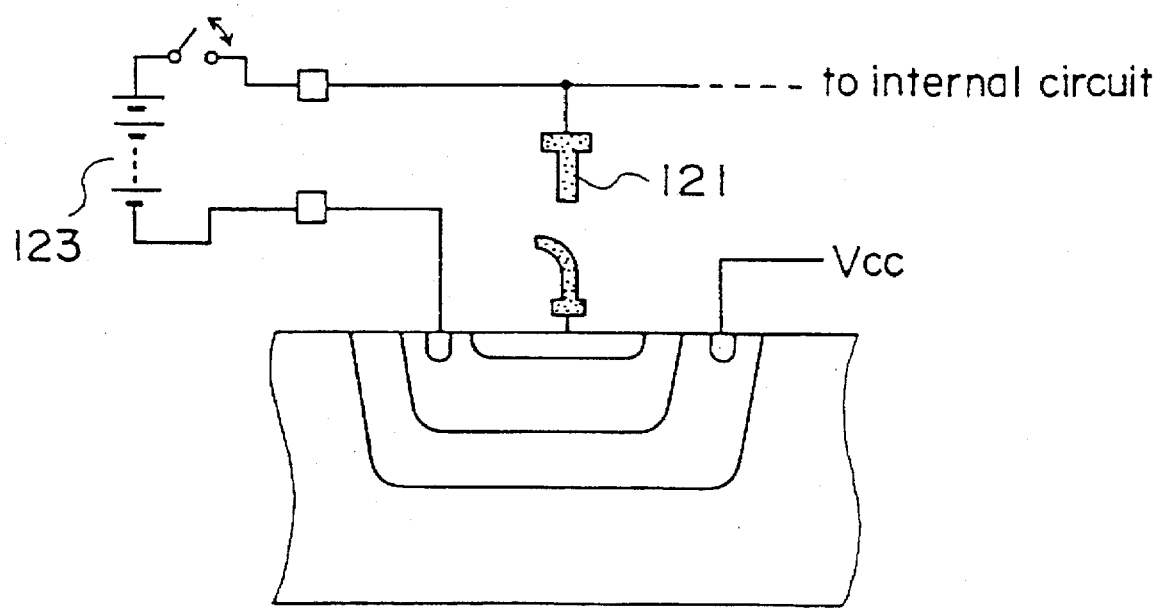
FIG. 3(b) illustrates the operation of the input protection circuit of FIG. 3(a)
Figure 4A:
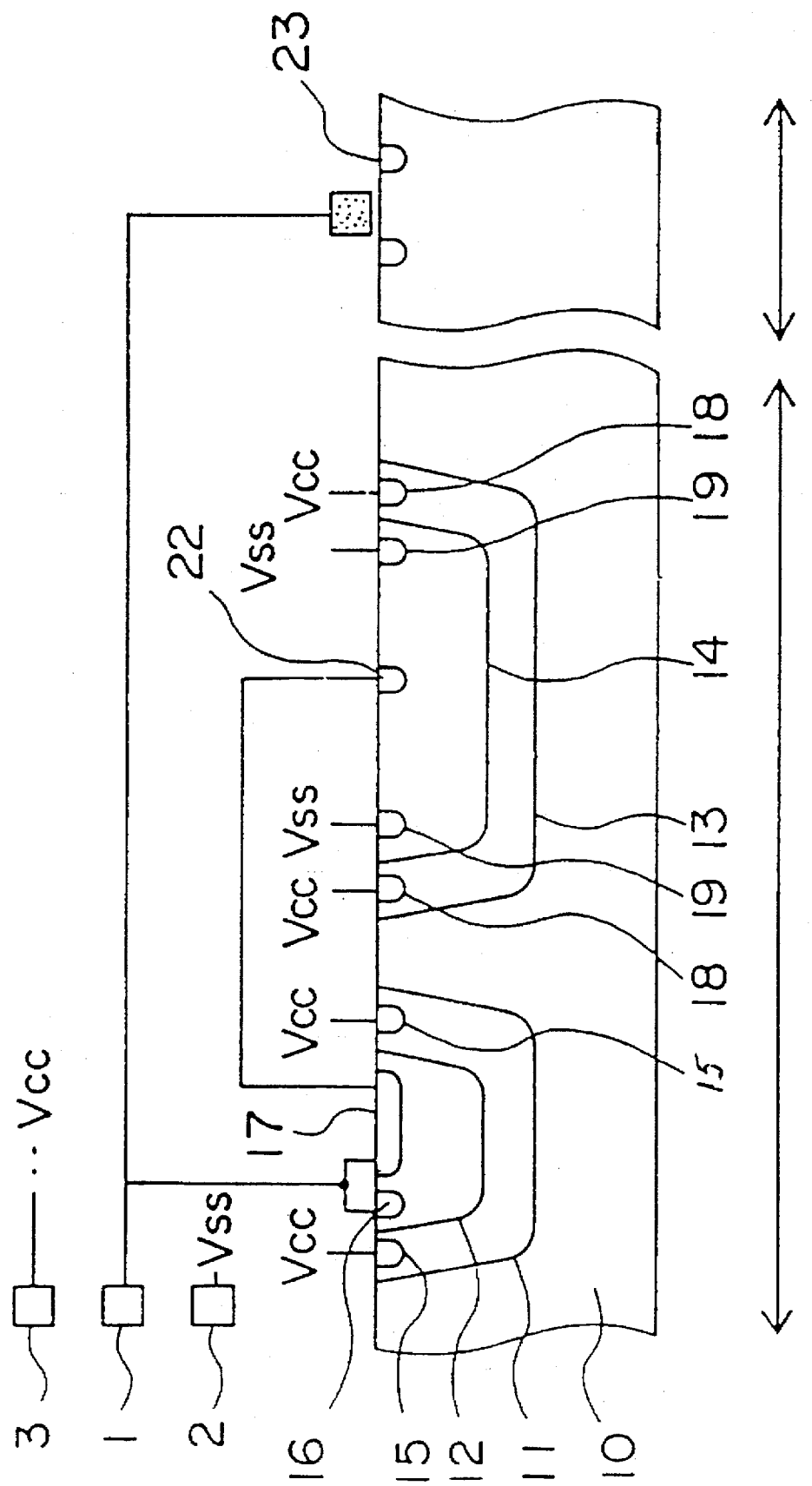
FIG. 4(a) is a sectional view of a portion of a semiconductor device having an input protection circuit in accordance with a first embodiment of the present invention.

FIG. 4(a) is a sectional view of a portion of a semiconductor device including an input protection circuit in accordance with a first embodiment of the present invention. A P-type silicon substrate 10 has an input protection circuit section and an internal circuit section. The semiconductor device includes a signal input pad 1, a ground pad 2 supplied with Vss (ground) potential, and a power supply pad 3 supplied with a Vcc (power supply) potential. For purposes of clarity, FIG. 4(a) illustrates pads 1, 2, and 3 as being above the surface of silicon substrate 10. However, in the actual device, these pads are formed on the surface of silicon substrate 10.

The structure of the input protection circuit section will now be described. P-type silicon substrate 10 has an N-type first outer well 11 (which is an N-type impurity region) formed therein. A P-type first inner well 12 (which is a P-type impurity region) is formed in N-type well 11. P-type silicon substrate 10 also has an N-type second outer well 13 formed therein. A P-type second inner well 14 is formed in N-type well 13. Wells 11 and 12 constitute a first "double well" structure and wells 13 and 14 constitute a second double well structure. These double well structures are electrically separated from each other. It can be seen that P-type well 12 and P-type well 14 are electrically separated and isolated by four PN junctions, namely, a first PN junction between P-type well 12 and N-type well 11, a second PN junction between P-type silicon substrate 10 and N-type well 11, a third PN junction between P-type silicon substrate 10 and N-type well 13, and a fourth PN junction between P-type well 14 and N-type well 13. N-type well 11 is supplied with Vcc via an N-type impurity region 15. A P-type impurity region 16 and a resistive element 17 are formed in P-type well 12. Resistive element 17 is constituted by an N-type impurity region as will be described in greater detail below with reference to FIG. 5. Both P-type impurity region 16 and a first terminal of resistive element 17 are connected to signal input pad 1. N-type well 13 is supplied with Vct via an N-type impurity region 18 formed therein and P-type well 14 is supplied with Vss via a P-type impurity region 19 formed therein. A second terminal of resistive element 17 is connected to an N-type impurity region 22 which is formed in P-type well 14. The second terminal of resistive element 17 may also be connected to additional N-type impurity regions 22 (not shown) formed in P-type well 14.

The internal circuit section of the semiconductor device includes a plurality of transistors, one of which is shown in FIG. 4(a) as transistor 23. The gate of transistor 23 is connected to signal input pad 1. As described above, the input protection circuit of the first embodiment of the present invention includes a signal input pad 1, a ground pad 2, N-type wells 11 and 13 formed in P-type silicon substrate 10, a P-type well 12 formed in N-type well 11, a P-type well 14 formed in N-type well 13, a resistive element 17 formed by an impurity diffusion region in P-type well 12, and at least one diode element formed in P-type well 14 and constituted by the PN junctions between N-type impurity regions 22 and P-type well 14. Accordingly, at least one input protection diode, formed by the PN junctions, and a resistive element are connected in series between pads 1 and 2.

The actual sizes of the double well structures are as follows. The depths of N-type wells 11 and 13 are approximately 8 micrometers; the depths of the P-type wells 12 and 14 are approximately 2 micrometers; and the depths of P-type and N-type impurity regions 15 to 19 and 22 are approximately 0.2 micrometers. The resistance of resistive element 17 is approximately 500 megohms. P-type impurity region 19 is a ring-like impurity region and thus surrounds an inner region of P-type well 14. N-type impurity region 15 is a ring-like impurity region and thus surrounds P-type well 12, and N-type impurity region 18 is a ring-like impurity region and thus surrounds P-type well 14.

Figure 4B:
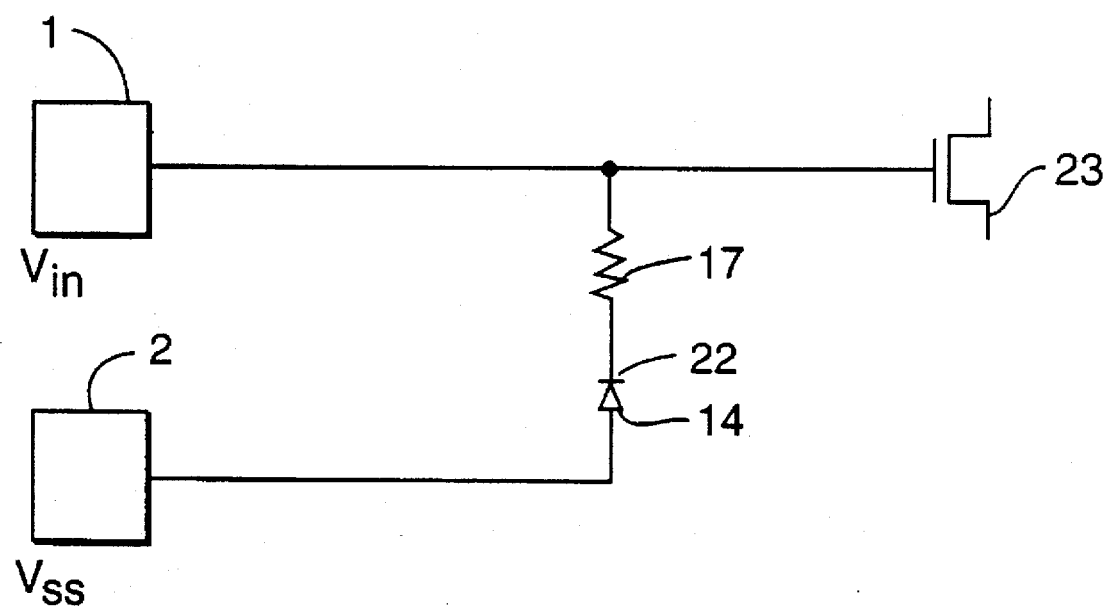
FIG. 4(b) is a circuit diagram of the input protection circuit of FIG. 4(a)

As described above, P-type well 12 is formed in N-type well 11 and thus N-type well 11 surrounds P-type well 12. Similarly, P-type well 14 is formed in N-type well 13 and thus N-type well 13 surrounds P-type well 14. Resistive element 17 is formed in P-type well 12 and the input protection diode is formed in P-type well 14. Thus, P-type well 12 and impurity regions 16 and 17 are electrically separated and isolated from P-type well 14 and impurity regions 19 and 22. The electrical separation and isolation of wells 12 and 14 advantageously permits the wells to have different well potentials. The structure of FIG. 4(a) prevents a breakdown of the internal circuit caused by a high voltage supplied to signal input pad 1. In addition, as can be seen with reference to the equivalent circuit diagram of FIG. 4(b), resistive element 17 and the input protection diode are connected in series between pads 1 and 2, thereby preventing accidental current flow and malfunction of the internal circuit. Also, because resistive element 17 is an N-type impurity diffusion region, problems which occur with a polysilicon resistive element (such as melt down) are eliminated, which is very beneficial for ESD testing.

Figure 5A:
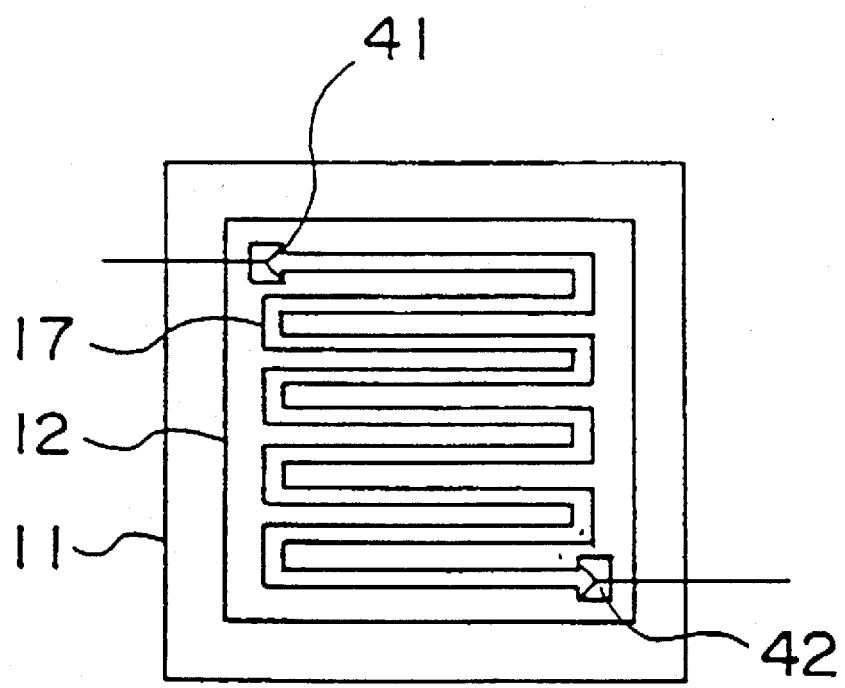
FIG. 5(a) is a plan view of resistive element 17 of the input protection circuit of the first embodiment of the present invention.
Figure 5B:
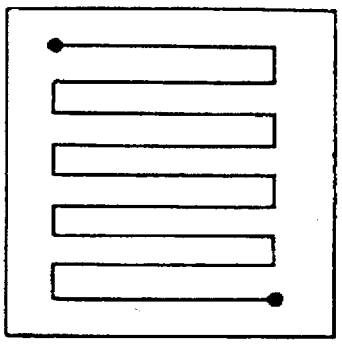
FIGS. 5(b)–5(h) show alternative patterns of resistive element 17.
Figure 5E:
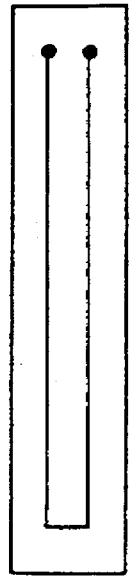
Figure 5F:
Figure 5C:
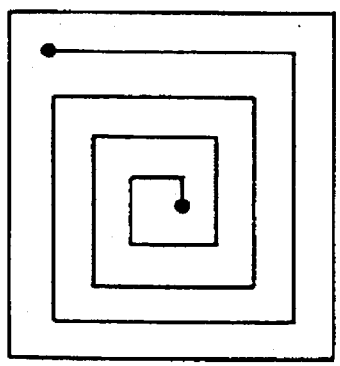
Figure 5G:
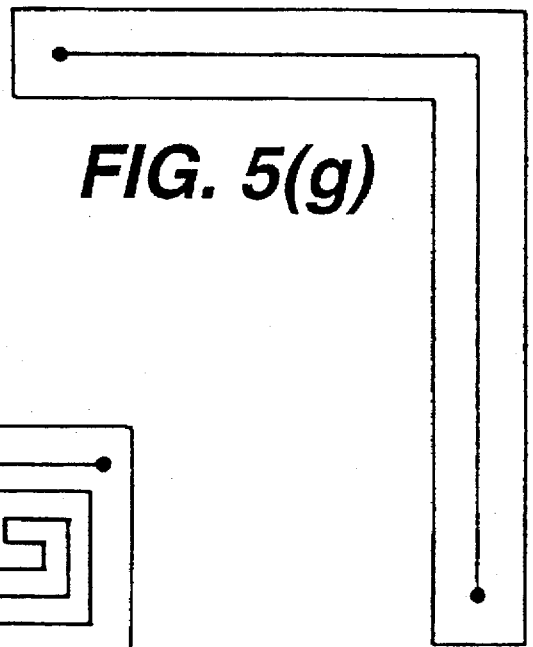
Figure 5D:
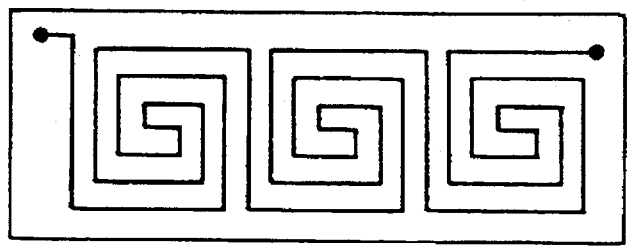

FIG. 5(a) is a plan view of resistive element 17 and wells 11 and 12. To simplify the drawing, regions 15 and 16 are not shown. As shown in FIG. 5(a), resistive element 17 is a thin, serpentine line of an N-type impurity diffusion which folds or turns several times within P-type well 12. Resistive element 17 is shown having a first terminal 41 and a second terminal 42. When the sheet resistance of the diffusion region is about 1K ohm/□ and the width of the line is about 0.8 micrometers, 400 mm of the line provides 500 megohms of resistance. The folds or turns of diffusion region reduce the pattern area. FIG. 5(b) is a schematic representation of the resistive element shown in FIG. 5(a).

The pattern of resistive element 17 is not limited to the pattern shown in FIG. 5(b). FIGS. 5(c) through 5(g) show alternative patterns for resistive element 17. Each of these patterns is suitable for use in a DRAM because of the reduced area occupation. Other patterns will of course be apparent those in the art.

Figure 5H:
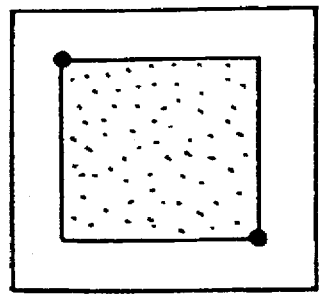

FIG. 5(h) shows yet another alternative arrangement for resistive element 17. In the arrangement of FIG. 5(h), impurities are diffused within a certain area having a predetermined shape, e.g. a square, in order to form resistive element 17.

Figure 5I:
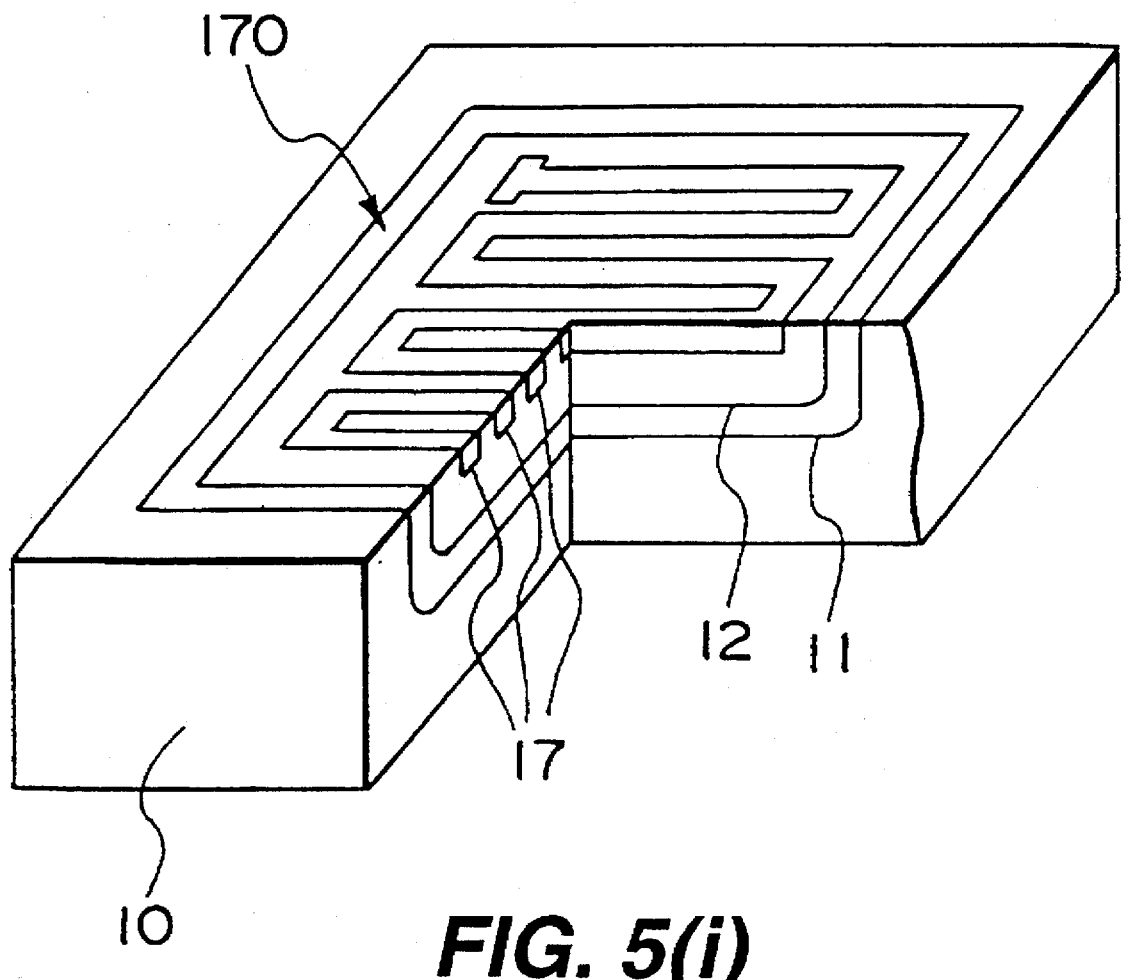
FIG. 5(i) is a cross sectional and perspective view of the resistive element of FIG. 5(a)

FIG. 5(i) is a cut-away sectional view of the resistive element of FIG. 5(a) which illustrates silicon substrate 10, impurity diffusion region 17, and wells 11 and 12, which form a resistive region 170. As noted above, the resistive element of the present invention is not limited to the specific shapes and patterns described above and broadly refers to resistive elements in which current flows from a first terminal to a second terminal.

Figure 6B:
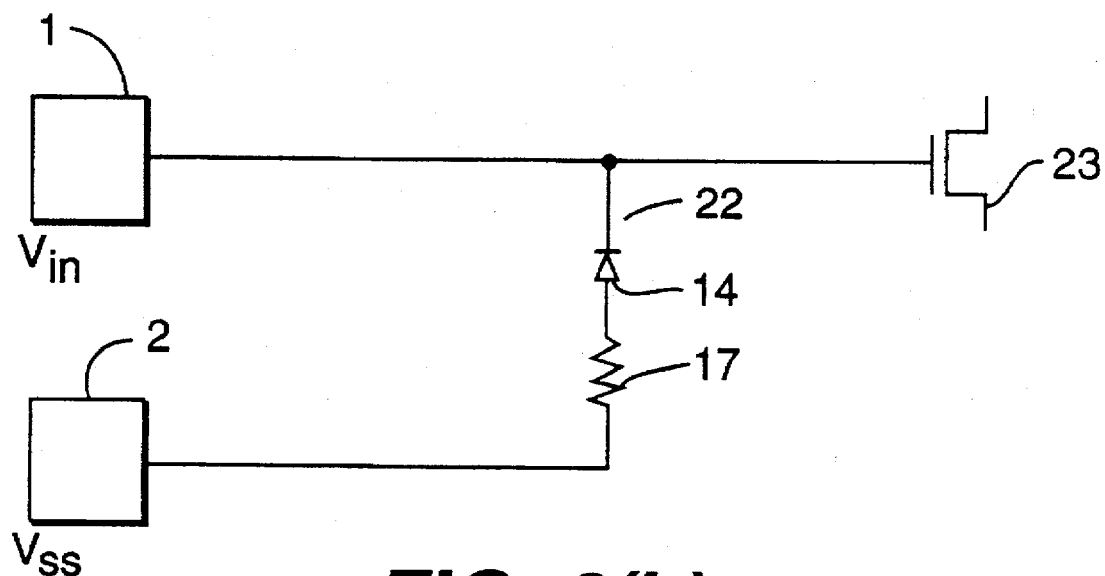
FIG. 6(b) is a circuit diagram of the input protection circuit of FIG. 6(a)
Figure 6A:
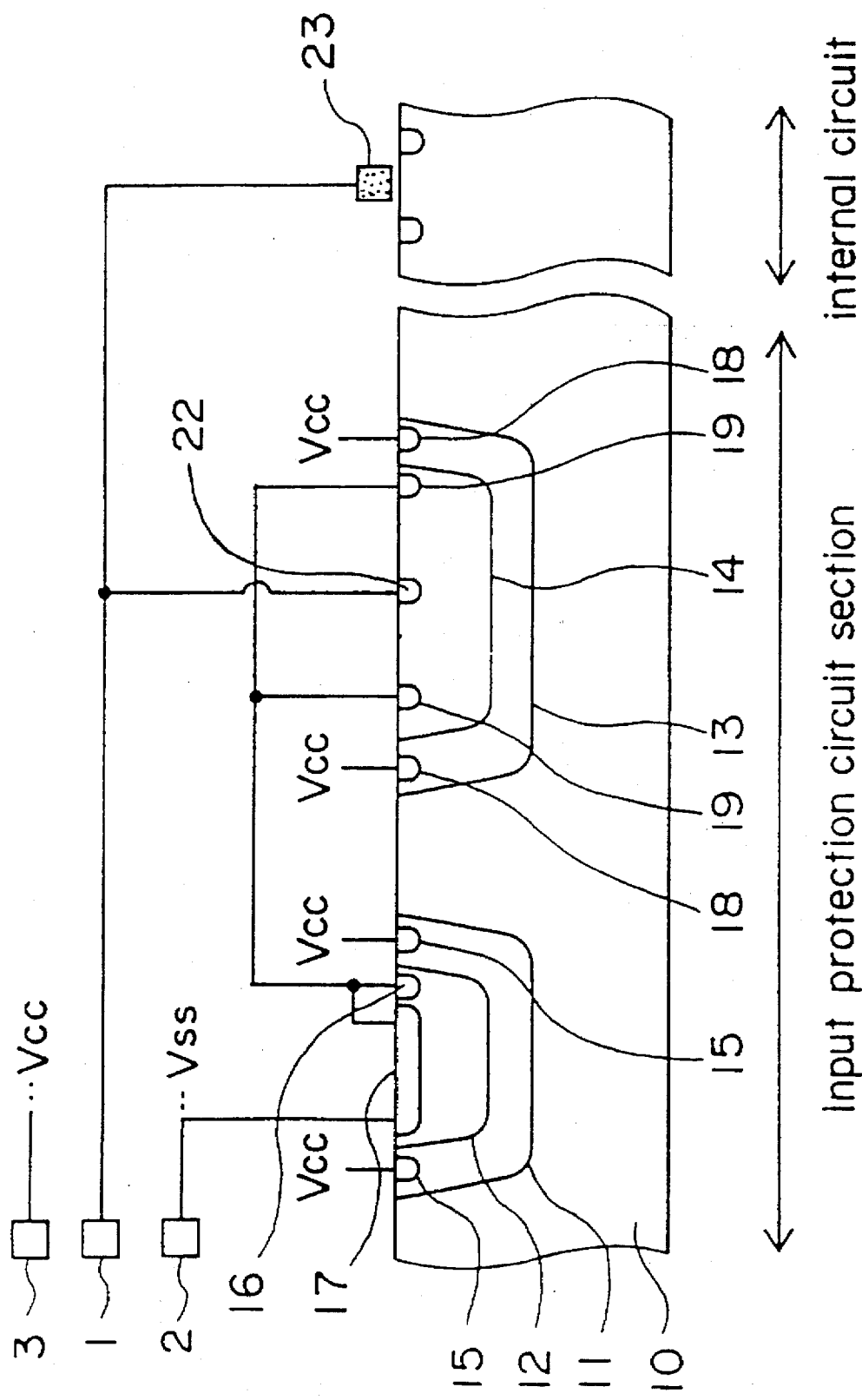
FIG. 6(a) is a sectional view of a portion of a semiconductor device having an input protection circuit in accordance with a second embodiment of the present invention.

A second embodiment of the present invention will now be described. FIG. 6(a) shows a sectional view of a portion of a semiconductor device including an input protection circuit in accordance with a second embodiment of the present invention. The well and impurity region structure of the input protection circuit of the second embodiment is essentially the same as the well and impurity region structure of the input protection circuit of the first embodiment as shown in FIG. 4. Accordingly, the elements of the second embodiment which are the same as those of the first embodiment are designated with the same reference numbers and a detailed description thereof is omitted. In the second embodiment, a first terminal of resistive region 17 is connected to ground pad 2. Impurity region 16 and a second terminal of resistive region 17 are connected to P-type well 14 via impurity region 19. Impurity region 22 is connected to signal input pad 1.

Accordingly, the input protection circuit of the second embodiment of the present invention includes signal input pad 1, ground pad 2, N-type outer wells 11 and 13 formed in P-type silicon substrate 10, P-type inner well 12 formed in N-type outer well 11, P-type inner well 14 formed in N-type outer well 13, resistive element 17 formed by an impurity diffusion region in inner well 12, and at least one diode element formed by a PN junction (formed by the boundary of N-type region 22 and P-type well 14) formed in inner P-type well 14. Accordingly, the input protection diode (formed by the PN junction) and resistive element 17 are inserted in series between pads 1 and 2.

As described above, outer N-type well 11 surrounds inner P-type well 12 and outer N-type well 13 surrounds inner P-type well 14. Resistive element 17 is formed in P-type well 12 and the input protection diode is formed in P-type well 14. Thus, P-type well 12 and impurity regions 16 and 17 are electrically separated and isolated from P-type well 14 and impurity regions 19 and 22. The electrical separation and isolation of wells 12 and 14 permits the wells to have different well potentials. The structure of FIG. 5(a) prevents a breakdown of the internal circuit caused by a high voltage supplied to signal input pad 1. In addition, as can be seen with reference to the equivalent circuit diagram of FIG. 6(b), the resistive element and the input protection diode are connected in series between pads 1 and 2, thereby preventing an accidental current flow and malfunction of the internal circuit. Still further, because the resistive element is formed by an N-type impurity diffusion region, problems which occur with a polysilicon resistive element (such as melt down) are eliminated, which is very beneficial for ESD testing.

The second embodiment of the instant invention provides yet another advantage in that a fast transmission of signals can be achieved. A resistive element formed by a diffusion region generally has a certain parasitic capacitance associated therewith. If the resistive element is directly connected to a signal input pad, the capacitance of the signal input pad increases, which causes a slow signal transmission, due to RC delays, from external devices to internal circuits. In contrast, in the second embodiment, the resistive element (and thus its corresponding parasitic capacitance) is not directly connected to signal input pad 1, thereby providing fast data transmission. The second embodiment is advantageously used for input protection circuits connected to address supply terminals and control terminals of DRAMs.

Figure 6C:
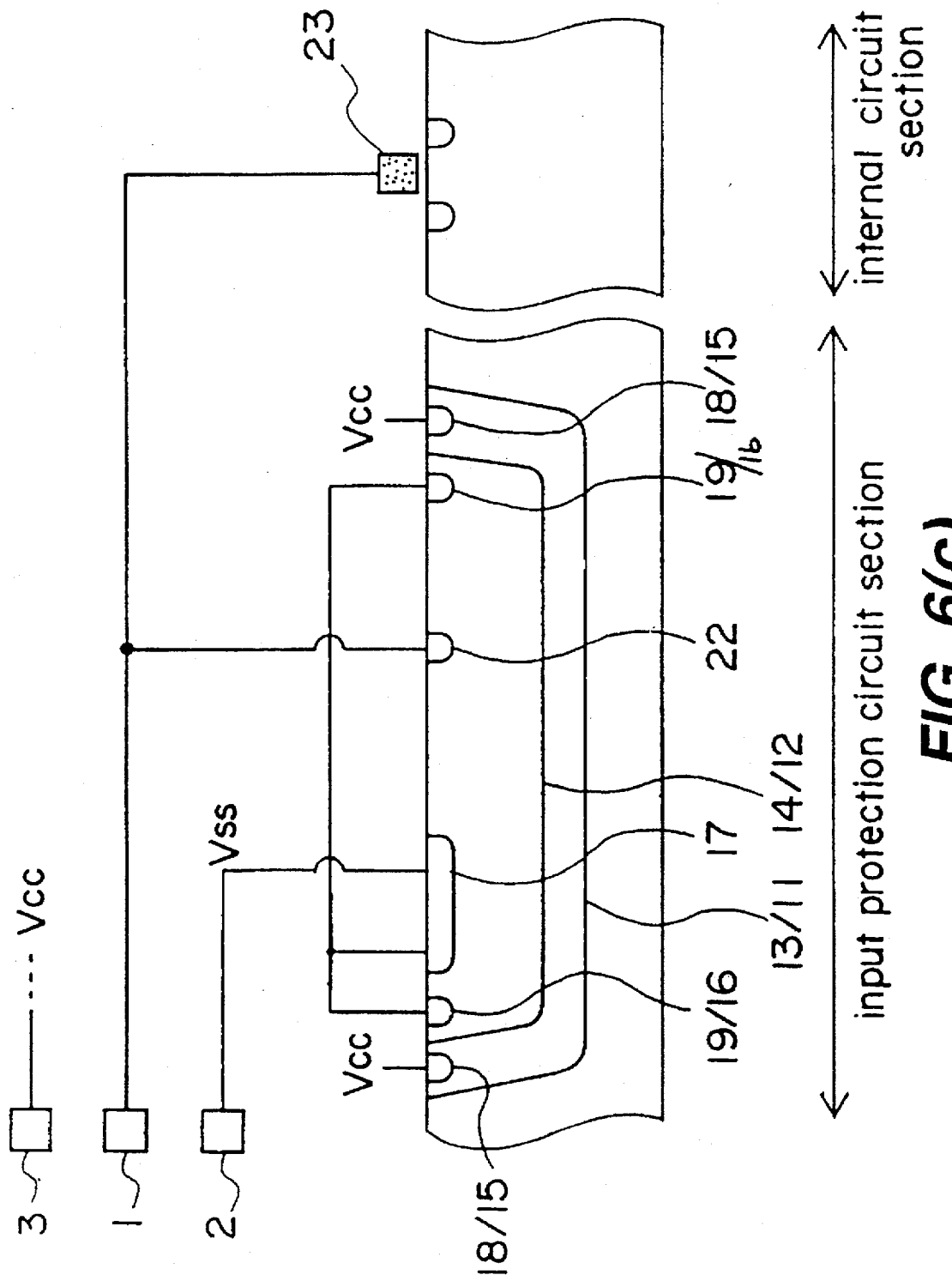
FIG. 6(c) is a sectional view of a portion of a semiconductor device having an input protection circuit which is a variation of the input protection circuit shown in FIG. 6(a)

FIG. 6(c) shows a variation of the input protection circuit shown in FIG. 6(a). In this variation, a single double well structure is utilized. Thus, inner wells 12 and 14 are merged into a single inner well 14/12 and outer wells 11 and 13 are merged into a single outer well 13/11. Therefore, regions 15 and 18 are merged into a single region 18/15 and regions 16 and 19 are merged into a single region 19/16. The advantage of the embodiment of FIG. 6(c) is that it occupies a smaller area on a semiconductor substrate. The equivalent circuit diagram of this variation is the same as that for FIG. 6(a) and thus reference may be made to FIG. 6(b).

Figure 7A:
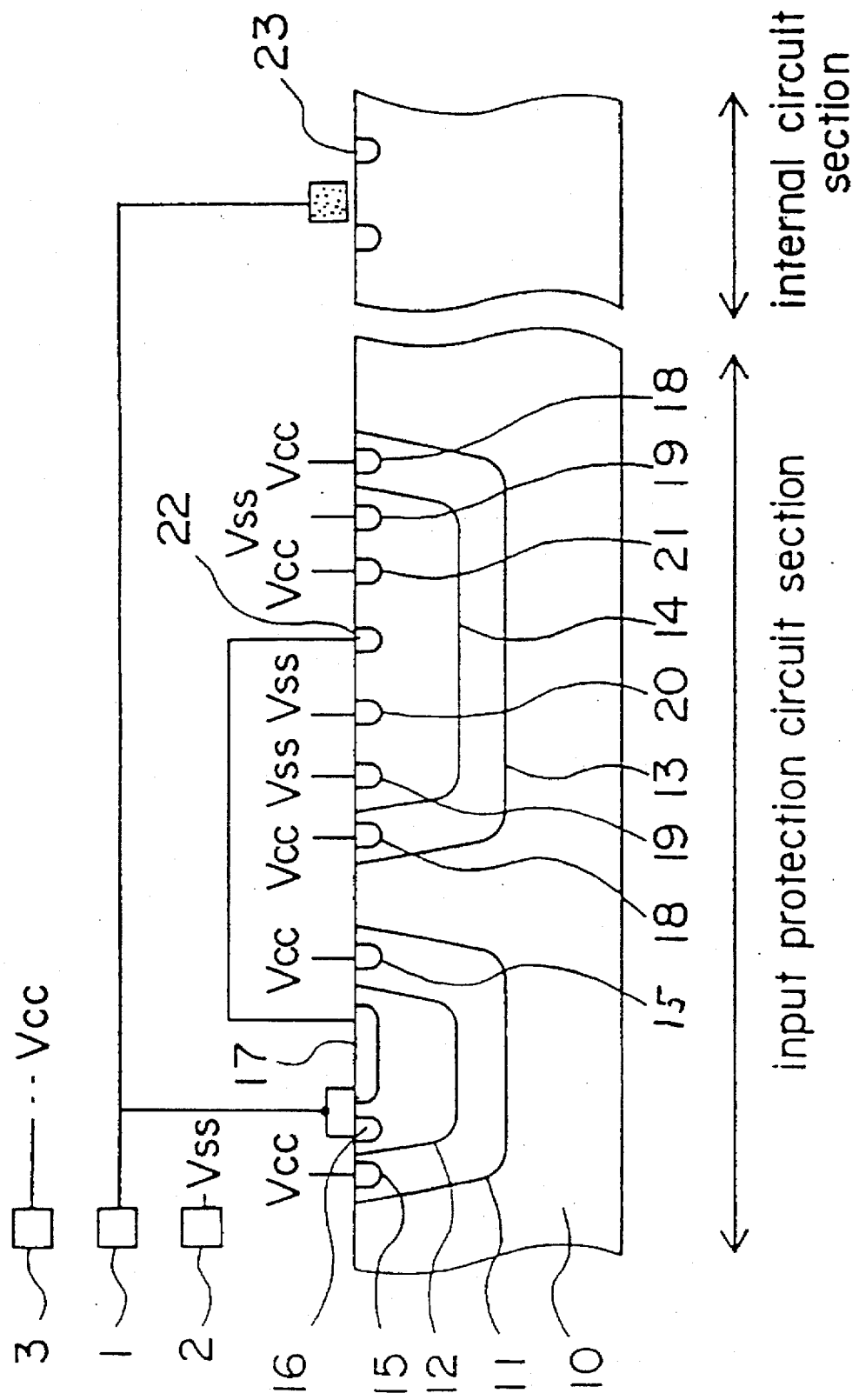
FIG. 7(a) is a sectional view of a portion of a semiconductor device having an input protection circuit in accordance with a third embodiment of the present invention.

FIG. 7(a) is a sectional view of a portion of a semiconductor device including an input protection circuit in accordance with a third embodiment of the present invention. A P-type silicon substrate 10 has an input protection circuit section and an internal circuit section. The semiconductor memory device includes a signal input pad 1, a ground pad 2 supplied with Vss (ground) potential, and a power supply pad 3 supplied with a Vcc (power supply) potential. For purposes of clarity, FIG. 7(a) illustrates pads 1, 2, and 3.as being above the surface of silicon substrate 10. However, in the actual device, these pads are formed on the surface of silicon substrate 10.

The structure of the input protection circuit section will now be described. P-type silicon substrate 10 has an N-type first outer well 11 (which is an N-type impurity region) formed therein. A P-type first inner well 12 (which is a P-type impurity region) is formed in N-type well 11. P-type silicon substrate 10 also has an N-type second outer well 13 formed therein. A P-type second inner well 14 formed therein. Wells 11 and 12 constitute a first "double well" structure and wells 13 and 14 constitute a second double well structure. These double well structures are electrically separated from each other. It can be seen that P-type well 12 and P-type well 14 are electrically separated and isolated by four PN junctions. N-type well 11 is supplied with Vcc via an N-type impurity region 15. A P-type impurity region 16 and a resistive element 17 are formed in P-type well 12. Resistive element 17 is constituted by an N-type impurity region as described above with reference to FIG. 5. Both P-type impurity region 16 and a first terminal of resistive element 17 are connected to signal input pad 1. N-type well 13 is supplied with Vcc via an N-type impurity region 18 formed therein and P-type well 14 is supplied with Vss via a P-type impurity region 19 formed therein. An N-type impurity region 20 supplied with Vss and an N-type impurity region 21 supplied with Vcc are formed in P-type well 14. A second terminal of resistive element 17 is connected to an N-type impurity region 22 which is formed between N-type impurity regions 20 and 21 and spaced therefrom by a predetermined distance of approximately 1 micrometer.

The internal circuit section of the semiconductor device includes a plurality of transistors, one of which is shown in FIG. 7(a) as transistor 23. The gate of transistor 23 is connected to signal input pad 1.

Figure 7B:
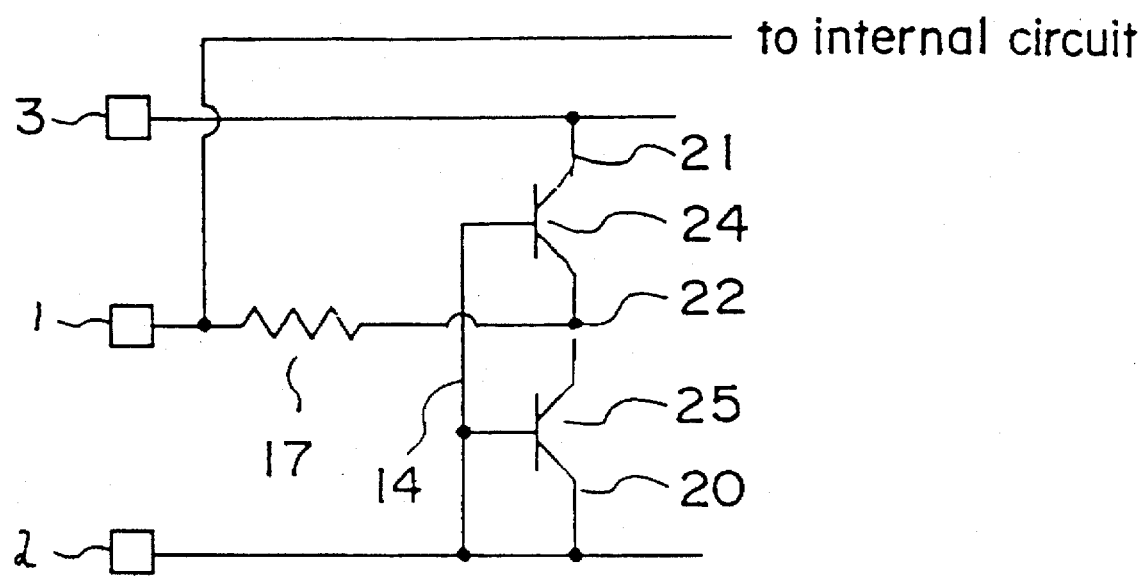
FIG. 7(b) is a circuit diagram of the input protection circuit of FIG. 7(a)

Specifically, with references to FIGS. 7(a) and 7(b), N-type impurity regions 20, 21 and 22 are formed in P-type well 14 with a predetermined spacing (or "pitch") therebetween. Impurity region 20 is connected to Vss and impurity region 21 is connected to Vcc:. These regions are formed and connected in the manner described in order to form parasitic bipolar transistors arranged as shown in FIG. 7(b). In response to a voltage applied to signal input pad 1, current flows from the collectors to the emitters of parasitic bipolar transistors 24 and 25. These bipolar transistors are more effective than simple diodes since the current-amplifying ability of the bipolar transistors permits greater current flow. Two parasitic bipolar transistors are formed for effectively protecting the internal circuit. Thus, a current can flow from pad 1 to both pads 2 and 3. Although the input protection circuit of the third embodiment includes two bipolar transistors, the invention is not limited in this respect. Accordingly, if desired, a single bipolar transistor may be provided or more than two bipolar transistors may provided within the spirit and scope of the present invention.

As described above, the input protection circuit of the third embodiment of the present invention includes a signal input pad 1, a ground pad 2, N-type wells 11 and 13 formed in P-type silicon substrate 10, a P-type well 12 formed in N-type well 11, a P-type well 14 formed in N-type well 13, a resistive element 17 formed by an impurity diffusion region in P-type well 12, a first parasitic bipolar transistor 24 having a base formed by well 14, a first current terminal formed by impurity region 22, and a second current terminal formed by impurity region 21, and a second parasitic bipolar transistor 25 having a base formed by well 14, a first current terminal formed by impurity region 22, and a second current terminal formed by impurity region 20. The current flow through the transistors 24 and 25 is determined by the potentials of the impurity regions. For example, referring to bipolar transistor 24, if the potential of impurity region 21 is greater than the potential of impurity region 22, current flows from impurity region 21 to impurity region 22. Similarly, if the potential of impurity region 22 is greater than the potential of impurity region 21, current flows from impurity region 22 to impurity region 21. The operation of bipolar transistor 25 is similar.

The actual sizes of the double well structures are as follows. The depths of N-type wells 11 and 13 are approximately 8 micrometers; the depths of the P-type wells 12 and 14 are approximately 2 micrometers; and the depths of P-type and N-type impurity regions 15 to 22 are approximately 0.2 micrometers. The resistance of resistive element 17 is approximately 500 megohms. P-type impurity region 19 is a ring-like impurity region and thus surrounds an inner region of P-type well 14. N-type impurity region 15 is a ring-like impurity region and thus surrounds P-type well 12, and N-type impurity region 18 is a ring-like impurity region and thus surrounds P-type well 14.

As described above, P-type well 12 is formed in N-type well 11 and thus N-type well 11 surrounds P-type well 12. Similarly, P-type well 14 is formed in N-type well 13 and thus N-type well 13 surrounds P-type well 14. Resistive element 17 is formed in P-type well 12 and the parasitic bipolar transistors are formed in P-type well 14. Thus, P-type well 12 and impurity regions 16 and 17 are electrically separated and isolated from P-type well 14 and impurity regions 19, 20, 21, and 22. The electrical separation and isolation of wells 12 and 14 advantageously permits the wells to have different well potentials. The structure of FIG. 7(a) prevents a breakdown of the internal circuit caused by a high voltage supplied to signal input pad 1. In addition, as can be seen with reference to the equivalent circuit diagram of FIG. 7(b), resistive element 17 and first bipolar transistor 24 are connected in series between pads 1 and 3 and resistive element 17 and second bipolar transistor 25 are connected in series between pads 1 and 2, thereby preventing accidental current flow and malfunction of the internal circuit. Also, because resistive element 17 is an N-type impurity diffusion region, problems which occur with a polysilicon resistive element (such as melt down) are eliminated, which is very beneficial for ESD testing.

Figure 8A:
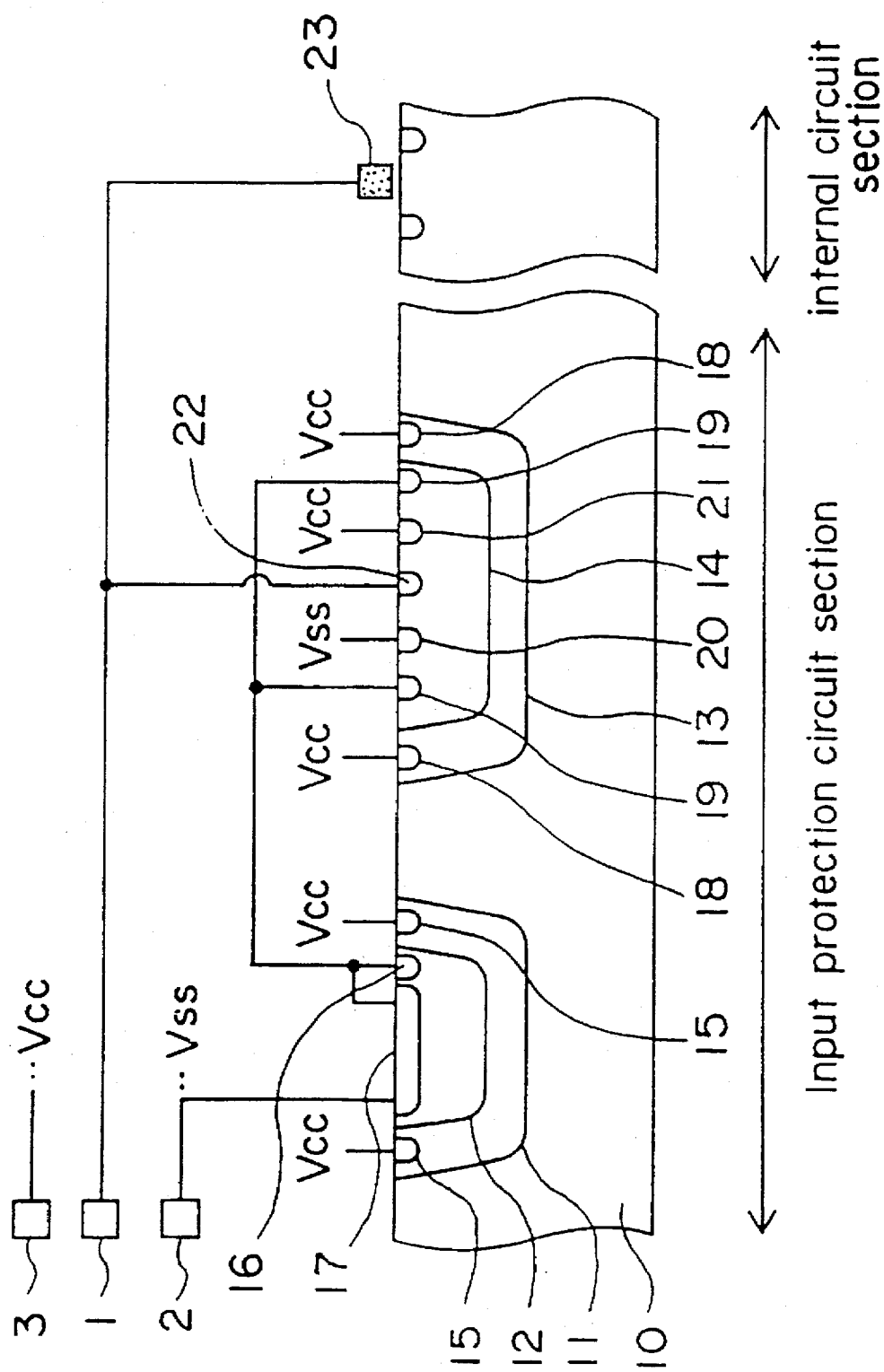
FIG. 8(a) is a sectional view of a portion of a semiconductor device having an input protection circuit in accordance with a fourth embodiment of the present invention.

FIG. 8(a) is a sectional view of a portion of a semiconductor device including an input protection circuit in accordance with a fourth embodiment of the present invention. The well and impurity region structure of the input protection circuit of the fourth embodiment is essentially the same as the well and impurity region structure of the input protection circuit of the third embodiment. Accordingly, the elements of the fourth embodiment which are the same as those of the third embodiment are designated with the same reference numbers and a detailed description thereof is omitted. In the fourth embodiment, a first terminal of resistive region 17 is connected to ground pad 2. Impurity region 16 and a second terminal of resistive region 17 are connected to P-type well 14 via impurity region 19. Impurity region 22 is connected to signal input pad 1.

Accordingly, the input protection circuit of the fourth embodiment of the present invention includes signal input pad 1, ground pad 2, N-type outer wells 11 and 13 formed in P-type silicon substrate 10, P-type inner well 12 formed in N-type outer well 11, P-type inner well 14 formed in N-type outer well 13, resistive element 17 formed by an impurity diffusion region in inner well 12, a first parasitic bipolar transistor having a base constituted by well 14, a first terminal constituted by impurity region 22, and a second terminal constituted by impurity region 21, and a second parasitic bipolar transistor having a base constituted by well 14, a first current terminal constituted by impurity region 22, and a second current terminal constituted by impurity region 20.

As described above, outer N-type well 11 surrounds inner P-type well 12 and outer N-type well 13 surrounds inner P-type well 14. Resistive element 17 is formed in P-type well 12 and the parasitic bipolar transistors are formed in P-type well 14. Thus, P-type well 12 and impurity regions 16 and 17 are electrically separated and isolated from P-type well 14 and impurity regions 19, 20, 21, and 22. The electrical separation and isolation of wells 12 and 14 advantageously permits the wells to have different well potentials. The structure of FIG. 8(a) prevents a breakdown of the internal circuit caused by a high voltage supplied to signal input pad 1. Furthermore, as can be seen with reference to equivalent circuit of FIG. 8(b), a first parasitic bipolar transistor 24 is connected between pads 1 and 3 and a second parasitic bipolar transistor is connected between pads 1 and 2, thereby preventing an accidental current flow and malfunction of the internal circuit. Still further, because the resistive element is formed by an N-type impurity diffusion region, problems which occur with a polysilicon resistive element (such as melt down) are eliminated, which is very beneficial for ESD testing.

The input protection circuit of the fourth embodiment of the present invention provides yet another advantage in that a fast transmission of signals can be achieved. A resistive element formed by a diffusion region usually has a certain parasitic capacitance associated therewith. If the resistive element is directly connected to a signal input pad, the capacitance of the signal input pad increases, which causes a slow signal transmission, due to RC delays, from external devices to internal circuits. In contrast, in the fourth embodiment, the resistive element (and thus its corresponding parasitic capacitance) is not directly connected to signal input pad 1, thereby providing fast data transmission. The fourth embodiment is advantageously used for input protection circuits connected to address supply terminals and control terminals of DRAMs.

Figure 8B:
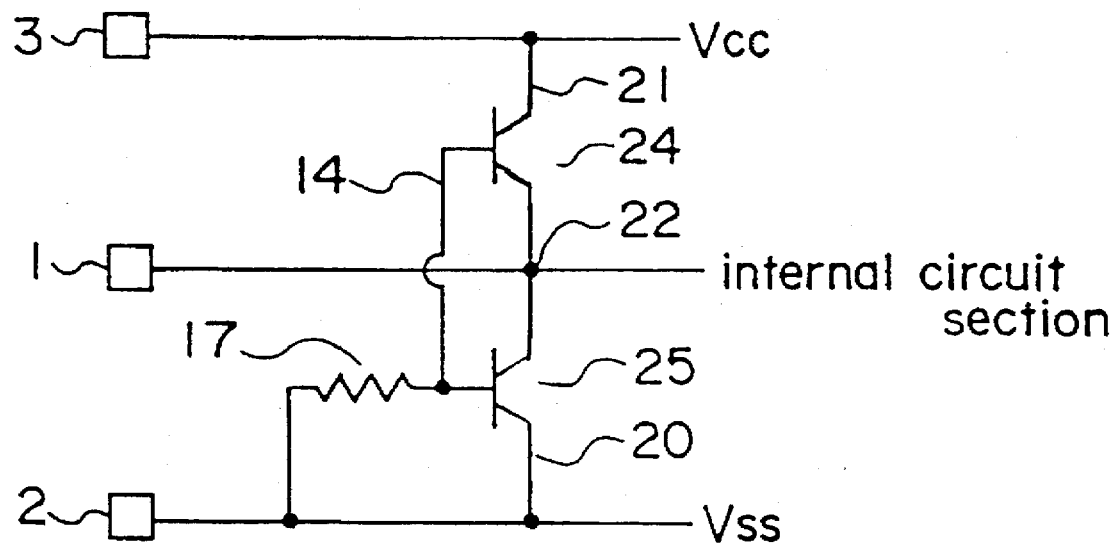
FIG. 8(b) is a circuit diagram of the input protection circuit of FIG. 8(a)
Figure 8C:
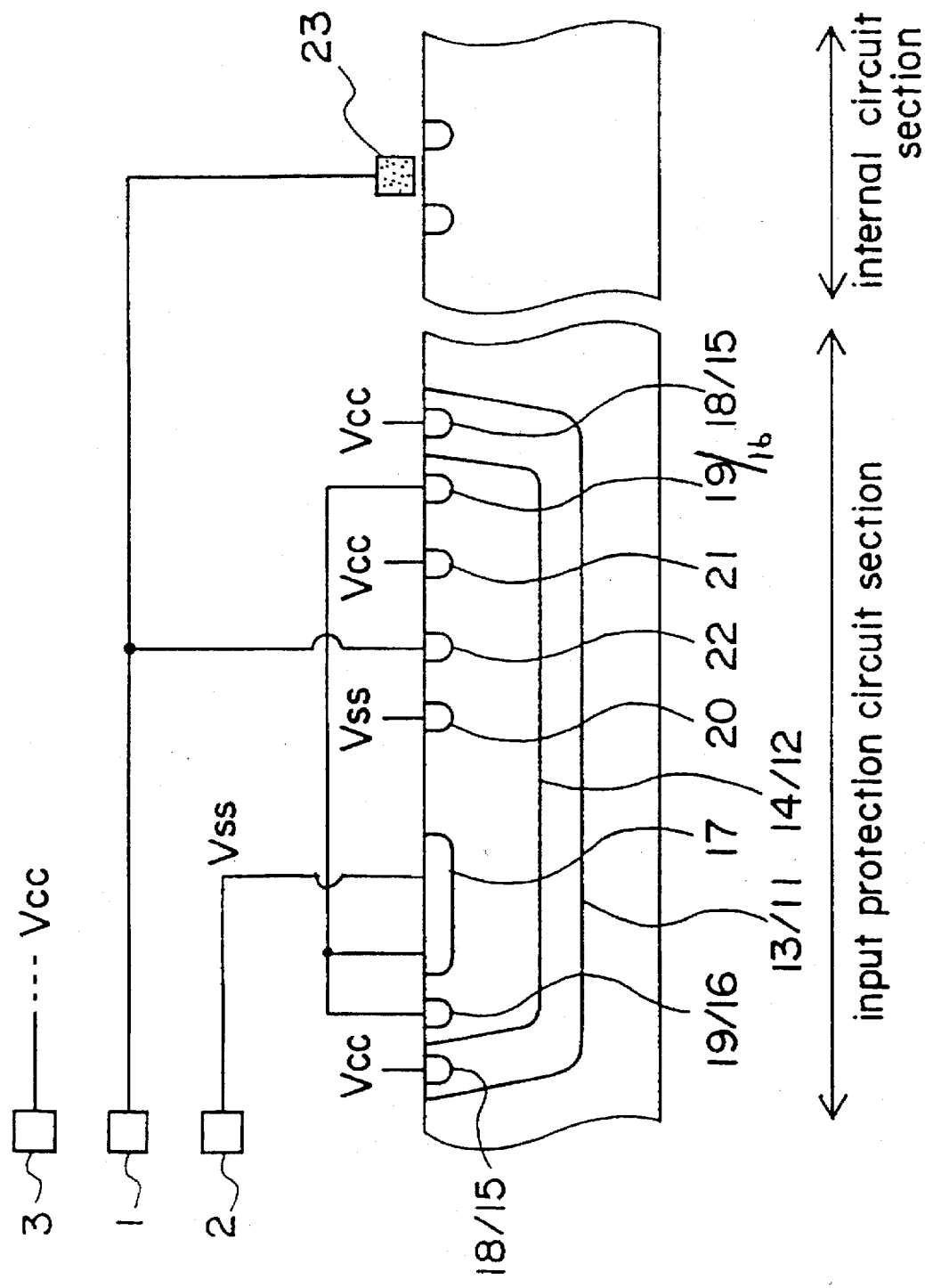
FIG. 8(c) is a sectional view of a portion of a semiconductor device having an input protection circuit which is a variation of the input protection circuit shown in FIG. 8(a)

FIG. 8(c) illustrates a variation of the input protection circuit shown in FIG. 8(b). In this variation, a single double well structure is utilized. Thus, inner wells 12 and 14 are merged into a single inner well 14/12 and outer wells 11 and 13 are merged into a single outer well 13/11. Therefore, regions 15 and 18 are merged into a single region 18/15 and regions 16 and 19 are merged into a single region 19/16. The advantage of the embodiment of FIG. 8(c) is that it occupies a smaller area on a semiconductor substrate. FIG. 8(b) is the equivalent circuit diagram of the input protection circuit of FIG. 8(c).

Figure 9:
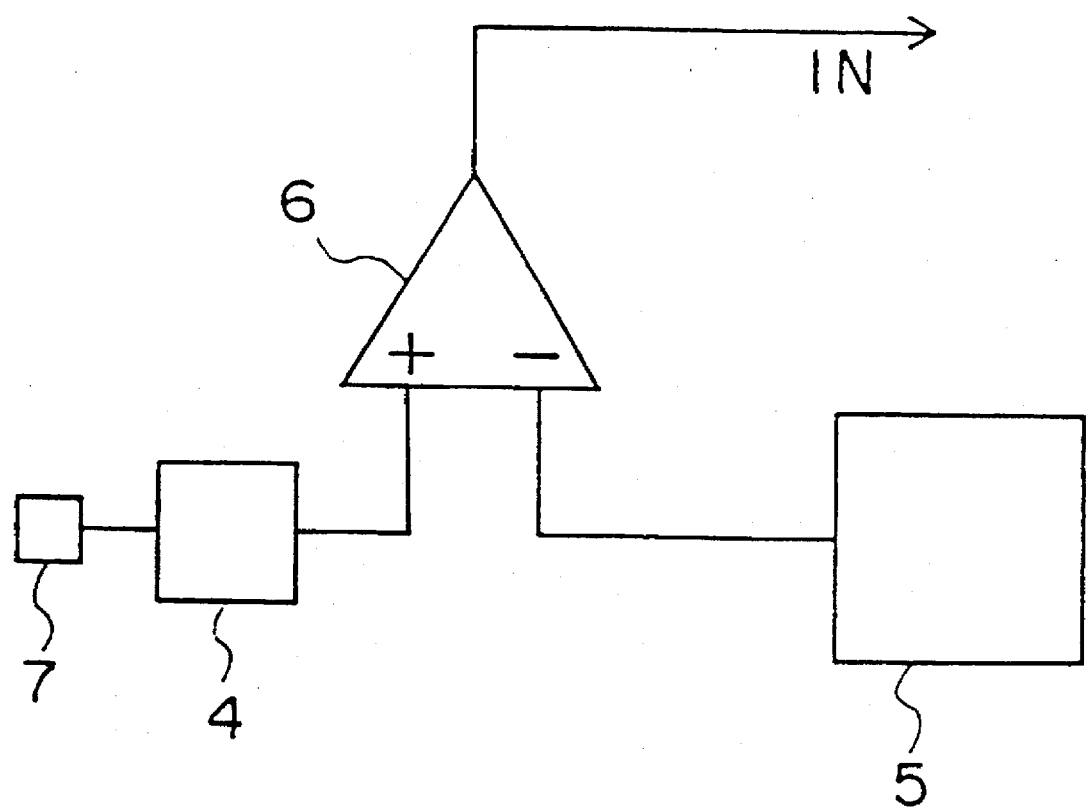
FIG. 9 is a circuit diagram of a device in which the input protection circuits of the first, second, third, and fourth embodiments may be utilized.

FIG. 9 is a circuit diagram of an exemplary device in which the input protection circuits of the first, second, third, and fourth embodiments may be utilized. A signal input pad 7 is connected to an input protection circuit 4 which is one of the type described above with respect to FIGS. 4, 6, 7, and 8. A comparison circuit 6, such as a current mirror type operational amplifier, has input terminals plus (+) and minus (−). The plus (+) terminal is connected to input protection circuit 4. The minus (−) terminal is connected to a reference potential generation circuit 5 which generates a constant reference voltage. A signal IN is supplied as the output signal of comparison circuit 6. Signal IN corresponds to a potential applied to signal input pad 7. The input circuit shown in FIG. 9 provides a very fast detection of an input signal, but it is very sensitive to a fluctuation of substrate potential because of the sensitivity of the reference potential generation circuit which is used. The fluctuation of the substrate potential can cause a fluctuation of the detection level of the circuit. However, if the input protection circuit 4 is one of the input protection circuits described above, resistive element 17 is electrically isolated from the substrate and the substrate potential fluctuation does not cause the detection level fluctuation.

Figure 10:
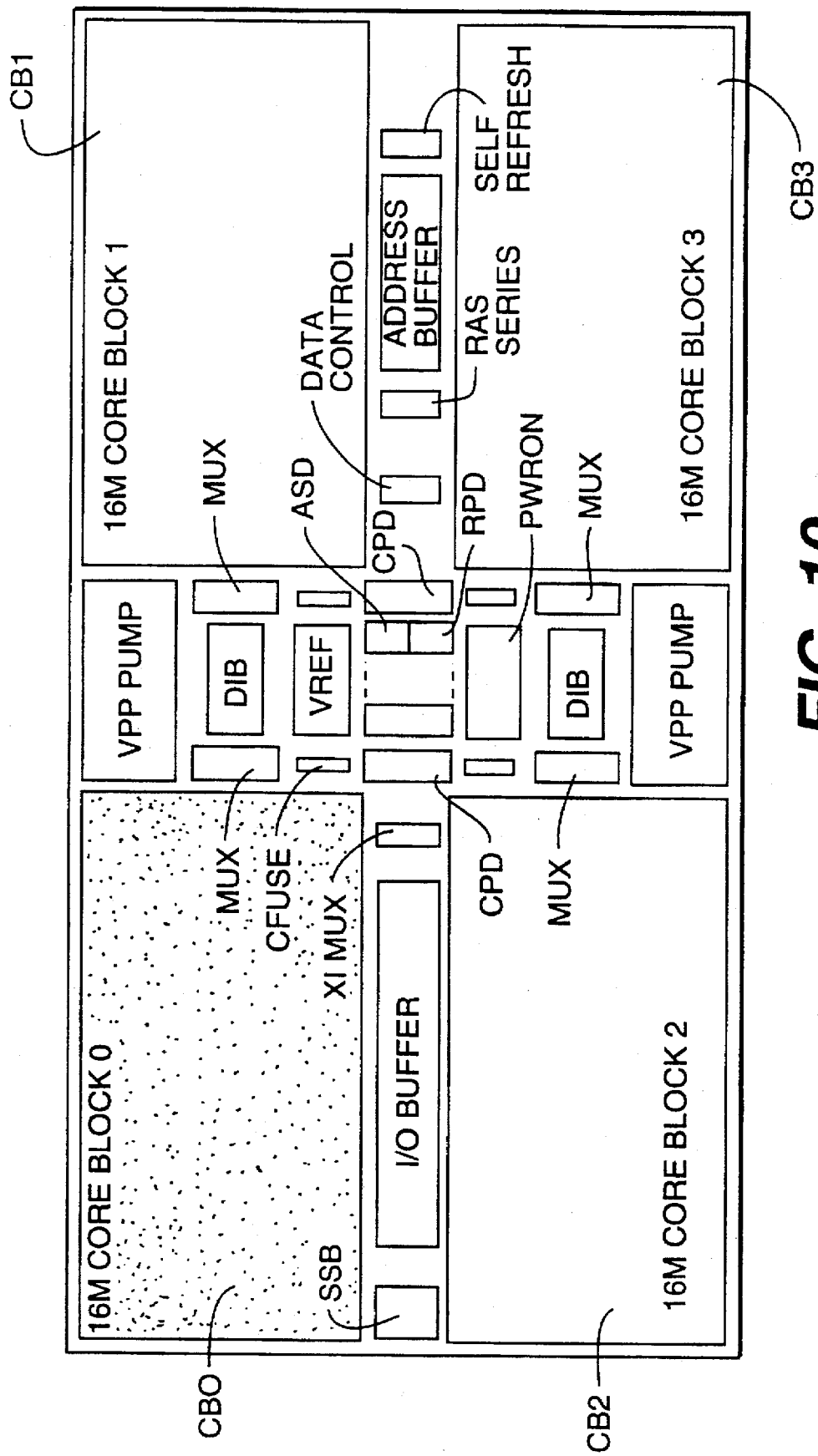
FIG. 10 is a plan view of a semiconductor memory chip in accordance with the present invention.

FIG. 10 is a plan view of a semiconductor memory chip in which the input protection circuits of the present invention may be utilized. The 64 megabit DRAM has four memory cell arrays (16M Core Blocks 0, 1, 2 and 3, which are hereinafter referred to as CB0, CB1, CB2 and CB3). Peripheral circuits are arranged between these core blocks. Boosted potential generators (VPP Pump), data multiplexers (MUX), data-in buffers (DIB), and fuses for column redundancy circuits (CFUSE) are arranged in the area between CB0 and CB1 and between CB2 and CB3. Reference potential generating circuits (VREF) are also arranged in the area between CB0 and CB1 and a power ON reset circuit (PWRON) is also arranged in the area between CB2 and CB3. PWRON detects the rising of Vcc and when Vcc is greater than a predetermined potential, e.g., 3 volts, PWRON generates a pulse designated "power on reset signal." An input and output buffer array (I/O Buffer), a substrate bias potential circuit SSB for generating and supplying a substrate potential of, for example, −1.2 volts to the semiconductor substrate, and data multiplexer circuit X1 MUX are arranged in the area between CB0 and CB2. Based on a row address X1, X1 MUX selectively transfers data to core blocks CB0, CB1, CB2, and CB3. For example, if the X1 address is 00, then data is transferred to CB0; if X1 is 01, the data is transferred to CB1; if X1 is 10, then data is transferred to CB2; and if XI is 11, then data is transferred to CB3. An address buffer array (Address buffer), a row system control circuit (RAS series), a data control circuit for controlling the data path from the core blocks to the buffer (Data Control), and a self-refresh controller for periodically generating a self refresh signal for triggering a refresh operation of the chip (Self Refresh) are arranged between core blocks CB1 and CB3. The DRAM also includes column partial decoders (CPD), row partial decoders (RPD), a column address switching circuit (ASD) for selecting a device type such as x1, x2, x4, x8, and x16, and an address transition detection circuit (ATD).

Figure 11:
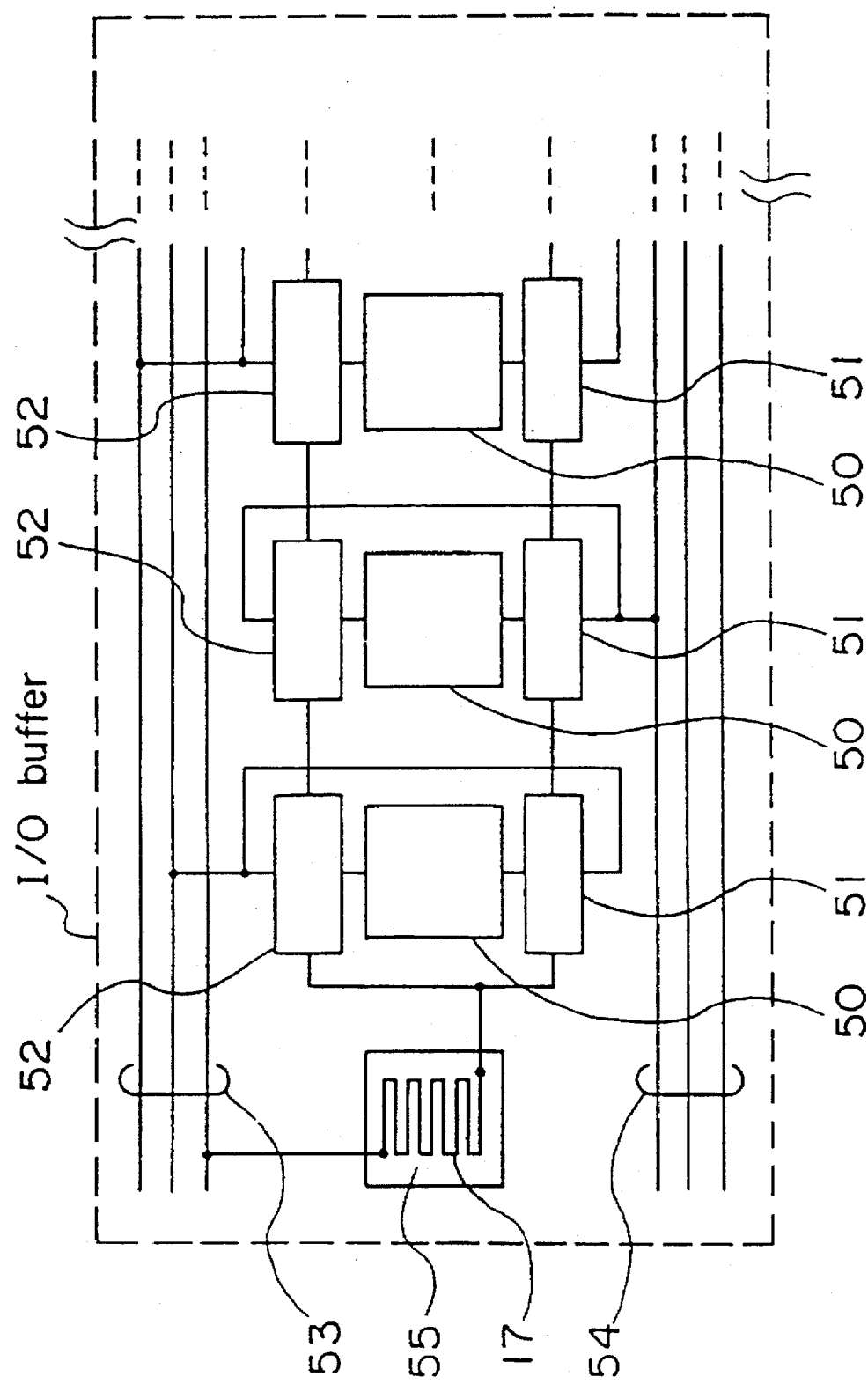
FIG. 11 is a detailed plan view of the input buffer circuits (I/O buffer, or Address buffer) used in the semiconductor memory chip shown in FIG. 10.

Input and output buffers are arranged along an input signal and power supply pads array. FIG. 11 shows a detailed plan view of the input buffer circuits (I/O buffer or Address buffer) used in the semiconductor memory chip of FIG. 10. A plurality of signal input pads 50 (address pads), each of which corresponds to a signal input pad 1 of the first, second, third, and fourth embodiments of the present invention, are linearly arranged and extend in the horizontal direction. Input bipolar transistors (or diodes) 51 and 52, formed as described above with reference to wells 13, 14 and regions 18, 19, 20, 21, 22 of the first, second, third, and fourth embodiments, are linearly arranged adjacent to pads 50. Data buses 53 and 54 run alongside the array of bipolar transistors 51 and 52. These buses are connected to transistors 51 and 52. A resistor portion 55 including a resistive element 17 is located at one end of the transistor array. Resistive element 17 includes a first terminal connected to data bus 53 and a second terminal connected to all of the bipolar transistors.

The arrangement shown in FIG. 11 is advantageous because resistive element 17 is shared by a plurality of bipolar transistors 51 and 52, thereby reducing the area of the I/O buffer. The structure of FIG. 11 is preferable for a center-pad type memory device such as shown in FIG. 10.

Figure 12:
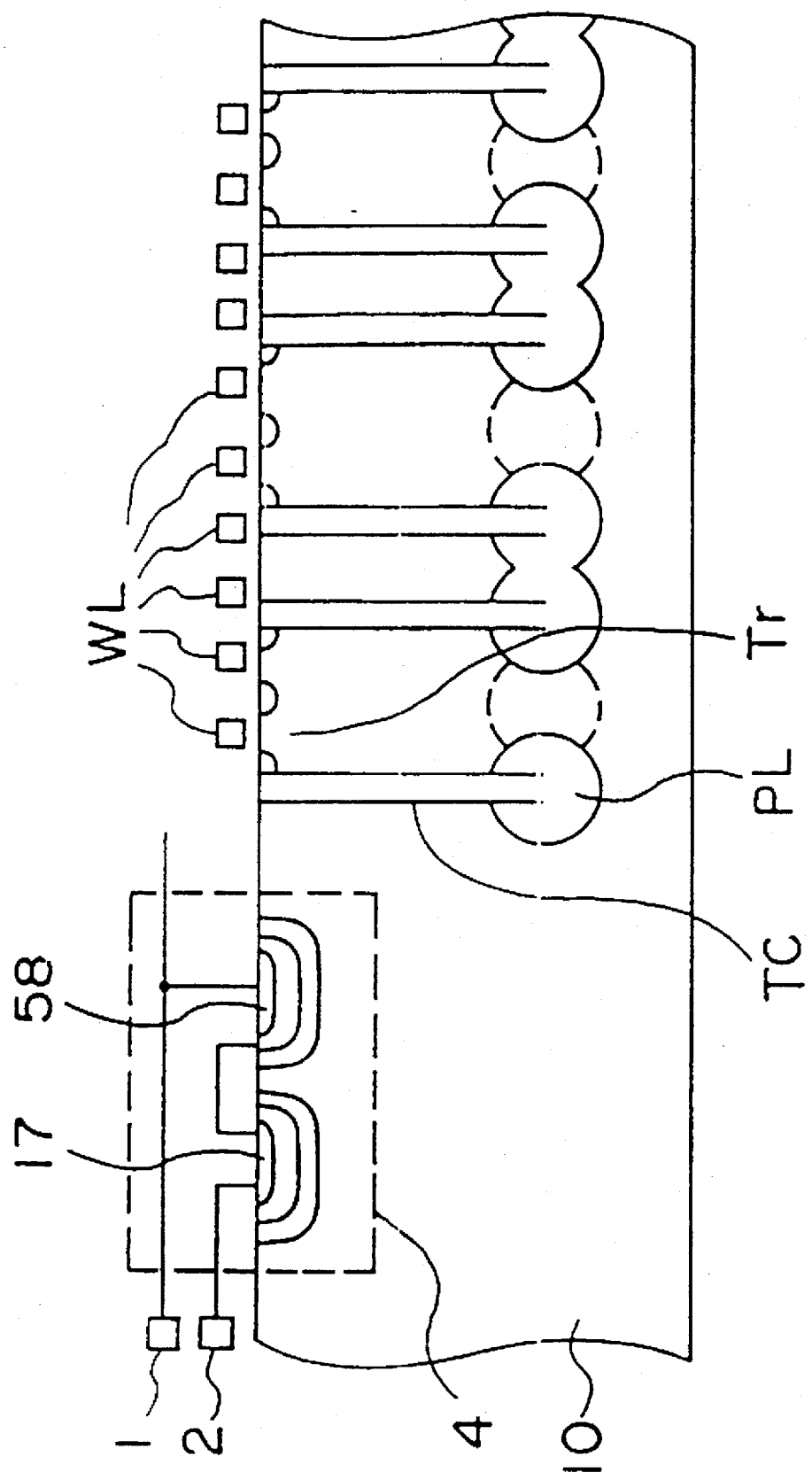
FIG. 12 is a cross sectional view of memory cells used in the semiconductor memory chip of FIG. 10.

FIG. 12 is a sectional view of memory cells used in the semiconductor memory chip of FIG. 10. Each of the DRAM cells includes one transistor (Tr) and one capacitor (TC). The capacitor is formed in a trench formed in semiconductor substrate 10 and the memory cells have a buried-plate electrode structure. The plate electrodes of the capacitors (i.e., the electrode opposite the charge storage electrode connected to the transistor) are connected to each other by ball-shaped N-type diffusion regions located at the bottoms of the trenches. The buried plate runs under the surface of the semiconductor substrate, thereby providing a relatively planar surface, except at the positions of word lines WL. Using the input protection circuit of the instant invention with a resistor which is isolated from the negatively-biased substrate, noises supplied to input pads do not reach the buried plate, thereby reducing the possibility of malfunctions of the DRAM.

Numerous modifications and variations of the present invention are possible in light of the above descriptions. It is therefore to be understood that, within the scope of the appended claims, the present invention can be practiced in a manner other than as specifically described herein.

I claim:

1. A semiconductor device, comprising:
   a semiconductor substrate of a first conductivity type;
   a first terminal;
   a second terminal;
   a first outer well of a second conductivity type formed in said semiconductor substrate;
   a first inner well of the first conductivity type formed in said first outer well;
   a second outer well of a second conductivity type formed in said semiconductor substrate;
   a second inner well of the first conductivity type formed in said second outer well;
   a resistive element comprising a diffusion region of the second conductivity type formed in said first inner well; and
   an input protection circuit element having at least one PN junction formed in said second inner well, wherein said resistive element and said input protection circuit element are connected in series between said first terminal and said second terminal and said resistive element is electrically isolated from said PN junction.

2. The semiconductor device according to claim 1, wherein said first terminal is a signal input pad, said second terminal is a constant power supply pad, and said resistive element is directly connected to said first terminal.

3. The semiconductor device according to claim 1, wherein said first terminal is a signal input pad, said second terminal is a constant power supply pad, and said resistive element is directly connected to said second terminal.

4. An input protection circuit formed on a semiconductor substrate, comprising:
   a resistive element comprising an impurity diffusion region electrically isolated from a main body of said semiconductor substrate by a first double well arrangement;
   a bipolar transistor connected to said resistive element, said bipolar transistor being electrically isolated from said main body of said semiconductor substrate by a second double well arrangement, wherein said first double well arrangement is independent of said second double well arrangement; and p1 an input terminal connected to said bipolar transistor.

5. An input protection circuit formed on a semiconductor substrate for protecting internal circuits, comprising:
   a first terminal;
   a second terminal;
   at least one PN junction, said PN junction being electrically separated from a main body of said semiconductor substrate; and
   a resistive element comprising an impurity diffusion region which is electrically separated from the main body of said semiconductor substrate, wherein said PN junction and said resistive element are connected in series between said first terminal and said second terminal and said resistive element is electrically isolated from said PN junction.

6. The input protection circuit according to claim 5, wherein said internal circuits comprise:
   a plurality of memory cells arranged in matrix, a plate electrode of said memory cells being formed under a surface of said semiconductor substrate, and said plate electrode and said resistive element being electrically isolated from each other.

7. A semiconductor device, comprising:
   a signal input terminal for receiving an externally supplied input signal;
   an input protection circuit connected to said signal input terminal;
   a reference voltage generation circuit for generating a constant reference voltage; and
   a comparison circuit connected to said input protection circuit and said reference voltage generation circuit for comparing the input signal and the reference voltage,
   wherein said reference voltage generation circuit and said input protection circuit are electrically isolated by a double well having at least two PN junctions.

8. The semiconductor device according to claim 7, wherein said input protection circuit comprises a bipolar transistor connected to said signal input terminal and a resistive element connected to said bipolar transistor, and said bipolar transistor and said resistive element are formed in separate double wells electrically isolated from each other.

9. A semiconductor device, comprising:
   a first pad;
   a second pad;
   a third pad:
   a first bipolar transistor having a base, a first current terminal connected to said second pad, and a second current terminal connected to said first pad;
   a second bipolar transistor having a base, a first current terminal connected to said second pad, and a second current terminal connected to said third pad;
   a resistive element separated from the first and the second bipolar transistors and electrically isolated from the current terminals of said first and second bipolar transistors by a double well structure, said resistive element having a first terminal connected to the bases of said first and second bipolar transistors and a second terminal connected to said third pad.

10. The semiconductor device according to claim 9, wherein said resistive element comprises an impurity diffusion region.

11. The semiconductor device according to claim 9, wherein the first current terminals of said first and second bipolar transistors are connected to a gate of a MOS transistor of an internal circuit.

12. A semiconductor device comprising:
   a first pad;
   a second pad;
   a third pad:
   a first bipolar transistor having a base connected to said third pad, a first current terminal, and a second current terminal connected to said first pad;
   a second bipolar transistor having a base connected to said third pad, a first current terminal, and a second current terminal connected to said third pad;
   a resistive element separated from said first and second bipolar transistors and electrically isolated from the current terminals of said first and second bipolar transistors by a double well structure, said resistive element having a first terminal connected to the first current terminals of said first and second bipolar transistors and a second terminal connected to said second pad.

13. The semiconductor device according to claim 12, wherein said resistive element comprises an impurity diffusion region.

14. The semiconductor device according to claim 12, wherein the first current terminals of said first and second bipolar transistors are connected to a gate of a MOS transistor of an internal circuit.

15. A semiconductor device, comprising:
   a plurality of pads arranged linearly;
   a plurality of input protection elements arranged linearly alongside said pads;
   a signal bus arranged along side said input protection elements; and
   a resistive element connected to and shared by each of said plurality of input protection elements.

16. The semiconductor device according to claim 15, wherein input protection elements are bipolar transistors, each provided for a corresponding one of said pads.

17. The semiconductor device according to claim 15, wherein said resistive element comprises an impurity diffusion region.

18. A semiconductor device, comprising:
   first, second, third, and fourth rectangular core blocks each having a plurality of memory cells arranged in matrix;
   a first buffer block arranged between said first and second rectangular core blocks, said first buffer block having a plurality of address pads and first input protection circuits arranged linearly; and
   a second buffer block arranged between said third and fourth rectangular core blocks, said second buffer block having a plurality of data I/O pads and second input protection circuits arranged linearly, wherein
   said first buffer block includes a first resistive element electrically isolated from said first, second, third, and fourth core blocks by a first double well; and
   said second buffer block includes a second resistive element electrically isolated from the first, second, third, and fourth core blocks by a second double well.

19. The semiconductor device according to claim 18, wherein said resistive element comprises an impurity diffusion region.

20. The semiconductor device according to claim 18, further comprising:
   a reference voltage generating circuit arranged between said first and third core blocks, said reference voltage generating circuit being electrically isolated from said first and second resistive elements by said first and second double wells.

21. The semiconductor device according to claim 10, wherein said impurity diffusion region comprises a predetermined number of turns, said turns defining folds in the impurity diffusion region, wherein a resistance of said resistive element is determined by a length of the impurity diffusion region, said length of said impurity diffusion region being varied by a number of folds and turns.

22. The semiconductor device according to claim 13, wherein said impurity diffusion region comprises a predetermined number of turns, said turns defining folds in the impurity diffusion region, wherein a resistance of said resistive element is determined by a length of the impurity diffusion region, said length of said impurity diffusion region being varied by a number of folds and turns.

23. The semiconductor device according to claim 17, wherein said impurity diffusion region comprises a predetermined number of turns, said turns defining folds in the impurity diffusion region, wherein a resistance of said resistive element is determined by a length of the impurity diffusion region, said length of said impurity diffusion region being varied by a number of folds and turns.

24. The semiconductor device according to claim 19, wherein said impurity diffusion region comprises a predetermined number of turns, said turns defining folds in the impurity diffusion region, wherein a resistance of said resistive element is determined by a length of the impurity diffusion region, said length of said impurity diffusion region being varied by a number of folds and turns.

25. The semiconductor device according to claim 4, wherein said bipolar transistor is a lateral-type bipolar transistor.

* * * * *